US012615988B2

(12) United States Patent
Vasanthakumar et al.

(10) Patent No.: US 12,615,988 B2
(45) Date of Patent: Apr. 28, 2026

(54) CLEANING BRUSH FOR SEMICONDUCTOR FABRICATION PROCESS

(71) Applicant: ENTEGRIS, INC., Billerica, MA (US)

(72) Inventors: Aravind Vasanthakumar, Singapore (SG); Thines Kumar Perumal, Singapore (SG); Subhash Guddati, Singapore (SG); Montray Leavy, Singapore (SG)

(73) Assignee: ENTEGRIS, INC., Billerica, MA (US)

( * ) Notice: Subject to any disclaimer, the term of this patent is extended or adjusted under 35 U.S.C. 154(b) by 401 days.

(21) Appl. No.: 18/204,238

(22) Filed: May 31, 2023

(65) Prior Publication Data

US 2023/0386868 A1      Nov. 30, 2023

Related U.S. Application Data

(60) Provisional application No. 63/347,426, filed on May 31, 2022.

(51) Int. Cl.
H01L 21/67 (2006.01)
H01L 21/02 (2006.01)

(52) U.S. Cl.
CPC .. H01L 21/67046 (2013.01); H01L 21/02065 (2013.01); H01L 21/02074 (2013.01)

(58) Field of Classification Search
None
See application file for complete search history.

(56) References Cited

U.S. PATENT DOCUMENTS

| 6,110,294 | A | 8/2000 | Shipley et al. |
| 6,783,445 | B2 * | 8/2004 | Torii ...................... B24B 53/12 |
| | | | 451/287 |
| 9,202,723 | B2 | 12/2015 | Withers |

(Continued)

FOREIGN PATENT DOCUMENTS

| CN | 213988832 | U | 8/2021 |
| CN | 114361079 | A | 4/2022 |

(Continued)

OTHER PUBLICATIONS

Machine Generated English Translation of BIB of KR1020070003130. Published Jan. 5, 2007. (Year: 2007).*

(Continued)

*Primary Examiner* — Sylvia Macarthur

(57) ABSTRACT

A cleaning brush for a semiconductor fabrication process is provided. The cleaning brush includes a core and a brush member. The core includes a circumferential portion and a closed end portion. The circumferential portion surrounds a rotation axis of the cleaning brush and defines an inlet opening for receiving a fluid. The closed end portion is connected to an end of the circumferential portion that is opposite to the inlet opening along the rotation axis. At least one elongated conduit is defined within the core and fluidly communicated with the inlet opening, and the circumferential portion includes a plurality of outlet channels passing therethrough to fluidly communicate with the elongated conduit, the outlet channels being tilted outwardly toward the closed end portion. The brush member is connected to an outer surface of the circumferential portion and covers all of the outlet channels.

12 Claims, 17 Drawing Sheets

(56)　　　　　References Cited

U.S. PATENT DOCUMENTS

| | | | |
|---|---|---|---|
| 10,029,399 B2 | 7/2018 | Benson | |
| 2001/0022008 A1 * | 9/2001 | Dickey | B08B 1/34 |
| | | | 15/77 |
| 2004/0216764 A1 | 11/2004 | Mikhaylich | |
| 2015/0183141 A1 | 7/2015 | Benson | |
| 2021/0060624 A1 | 3/2021 | Tien | |
| 2023/0386868 A1 * | 11/2023 | Vasanthakumar | |
| | | | H01L 21/67046 |

FOREIGN PATENT DOCUMENTS

| | | | | |
|---|---|---|---|---|
| CN | 114496833 A | | 5/2022 | |
| KR | 2007003130 A | * | 1/2007 | |
| TW | 476099 B | | 2/2002 | |
| WO | WO-2013049207 A2 | * | 4/2013 | H01L 21/67046 |

OTHER PUBLICATIONS

Machine Generated English Translation of Description of KR1020070003130. Published Jan. 5, 2007. (Year: 2007).*

Machine Generated English Translation of Claims of KR1020070003130. Published Jan. 5, 2007. (Year: 2007).*

* cited by examiner

31

32

31

32

CLEANING BRUSH FOR SEMICONDUCTOR FABRICATION PROCESS

FIELD

The present disclosure is generally directed to a cleaning brush for removing residues from a semiconductor substrate in a semiconductor fabrication process. In particular, the present disclosure is directed to a cleaning brush in a post-CMP cleaning process.

BACKGROUND

Integrated circuits can be formed on semiconductor substrates, particularly silicon wafers, by the sequential deposition of conductive, semiconductive and insulative layers on the wafer. Circuitry features can be etched on after each layer is deposited. After a series of layers have been deposited and etched, the uppermost surface of the substrate can become increasingly non-planar. Non-planar surfaces can cause problems in the photolithographic steps of the integrated circuit fabrication process.

In order to remove and/or polish certain surfaces of a microelectronic device wafer, a chemical-mechanical polishing (CMP) process, also called chemical-mechanical planarization, is performed over the semiconductor substrates. The CMP process refers to a method of removing layers of solid through chemical-mechanical polishing carried out for the purpose of surface planarization and definition of the metal interconnecting pattern. In a typical CMP operation, a rotating polishing pad, which receives a chemically reactive slurry, is used to polish the outermost surface of the substrate. The substrate is positioned over the polishing pad and is held in place by a retaining ring. Typically, the substrate and retaining ring are mounted on a carrier or polishing head. A controlled force is exerted on the substrate by the carrier head to press the substrate against the polishing pad. The movement of the polishing pad across the surface of the substrate causes material to be chemically and mechanically removed from the surface of the substrate.

After polishing, contamination, including slurry particles, organic residues and/or metallic impurities, may be present on the wafer surface and must be removed. If it is not removed, such contamination may lead to various defects, such as scratches, corrosion spots, etc., in the following processing steps, thereby causing a decrease in the product yield of the integrated circuits. Accordingly, what is needed is a system and method for effectively removing contamination from the semiconductor substrate after a CMP process that addresses the above-mentioned issues.

SUMMARY

Briefly, the present disclosure provides a cleaning brush including a core and a brush member. The a core includes a circumferential portion surrounding a rotation axis of the cleaning brush and defining an inlet opening for receiving a fluid; and a closed end portion connected to an end of the circumferential portion that is opposite to the inlet opening along the rotation axis. At least one elongated conduit is defined within the core and fluidly communicated with the inlet opening, and the circumferential portion includes a plurality of outlet channels passing therethrough to fluidly communicate with the elongated conduit, the outlet channels being tilted outwardly toward the closed end portion. The brush member is connected to an outer surface of the circumferential portion and covering all of the plurality of outlet channels.

In another aspect, the present disclosure provides a cleaning brush including a core and a brush member. The a core includes a circumferential portion surrounding a rotation axis of the cleaning brush and defining an inlet opening for receiving a fluid; and a closed end portion connected to an end of the circumferential portion that is opposite to the inlet opening along the rotation axis. At least one elongated conduit is defined within the core and fluidly communicated with the inlet opening, and the circumferential portion includes a plurality of outlet channels passing therethrough to fluidly communicate with the elongated conduit. In addition, a first zone, a second zone and a third zone of the core are defined in order along a direction from the inlet opening to the closed end portion, a total volume, in unit length of the core, of the elongated conduit and the outlet channels within the respective first, second and third zones gradually decreases. The brush member is connected to an outer surface of the circumferential portion and covering all of the plurality of outlet channels.

In still another aspect, the present disclosure provides a CMP (chemical mechanical planarization) apparatus includes a CMP module and a post-CMP cleaning module. The CMP module is configured to perform a CMP process over a semiconductor wafer. The post-CMP cleaning module is positioned at a downstream of the CMP module and includes a core and a brush material surrounding the core and configured to perform a cleaning process over the semiconductor wafer. An inlet opening, an elongated conduit and a plurality of outlet channels are arranged in the core to guide a liquid flowing into the core via the inlet opening to the brush material by passing through the elongated conduit and the outlet channels. At least the following three parameters of a first and a second of the outlet channels spaced from the inlet opening by different distances are different such that a preferential flow distribution or a targeted flow distribution of the liquid in the core is exhibited: (a) a width of the outlet channels; (b) a cross-sectional shape of the outlet channels; and (c) a tilt angle of the outlet channels relative to a length direction of the core.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
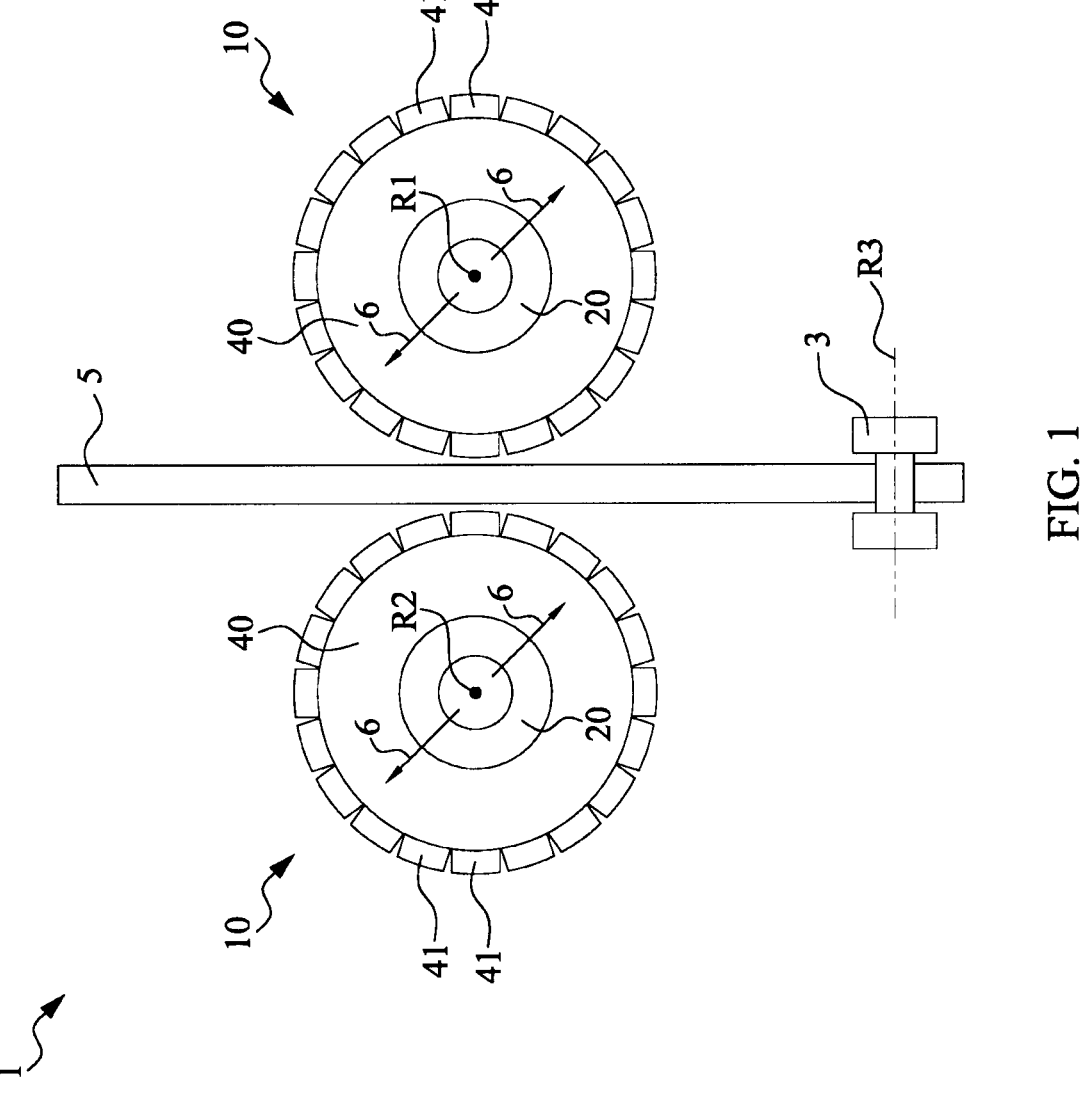
FIG. 1 is a front side perspective view of a post-CMP cleaning module in accordance with at least one example embodiment.

In the following detailed description, reference is made to the accompanying drawings, which form a part of the description. In the drawings, similar symbols typically identify similar components, unless the context dictates otherwise. Furthermore, unless otherwise noted, the description of each successive drawing may reference features from one or more of the previous drawings to provide a clearer context and a more substantive explanation of the current example embodiment. Still, the example embodiments described in the detailed description, drawings, and claims are not intended to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may only be used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Embodiments of the present disclosure provide a brush design with improved performance, including consistent and even fluid distribution across the entire length of the brush. Such an even fluid distribution results in consistent and reduced cleaning time as well as improved and uniform cleaning performance for the brush itself or for the substrate to be cleaned by the brush, as compared to a brush with evenly spaced discharging outlets which perpendicularly extend relative to a rotation axis.

In one exemplary embodiment, the inventive brush is used in a CMP (chemical mechanical planarization) system to remove contaminations, such slurry particles, organic residues and/or metallic impurities, which are attached to the substrate in a CMP process. However, it should be understood that the present disclosure is not limited to a CMP system, and the brushes of various embodiments disclosed herein are applicable to other substrate processing tools in a semiconductor manufacturing field. For example, the brushes can be used to clean a semiconductor wafer after a chemical etching process, an epitaxial growth process, etc.

Figure 2:
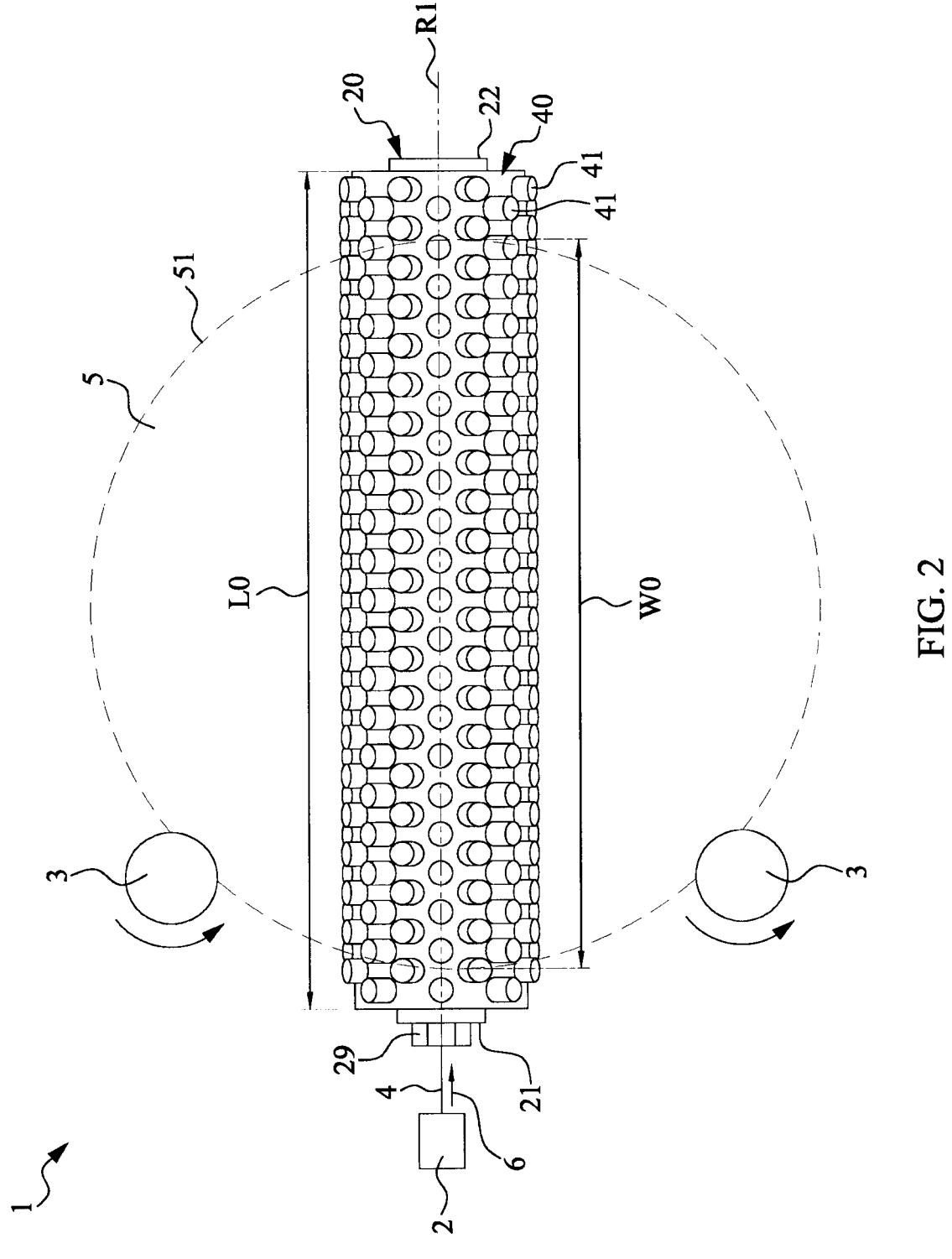
FIG. 2 is a right side perspective view of a post-CMP cleaning module in accordance with at least one example embodiment.

FIG. 1 is a front side perspective view of a post-CMP cleaning module 1, and FIG. 2 is a right side perspective view of the post-CMP cleaning module 1 in accordance with at least one example embodiment. In accordance with some embodiments of the present disclosure, the post-CMP cleaning module 1 includes a pair of cleaning brushes 10 and a number of rollers 3. The two cleaning brushes 10 are configured to clean the top and bottom surfaces of a semiconductor wafer 5. The rollers 3 are configured to abut against the edge of the semiconductor wafer 5 and to rotate the semiconductor wafer 5 in a perpendicular direction. During a cleaning process, the two cleaning brushes 10 are driven to rotate about rotation axis R1 and R2, and a predetermined external force is applied to the cleaning brushes 10 such that the surfaces of the cleaning brushes 10 press against the surfaces of the semiconductor wafer 5. Meanwhile, the rollers 3 may be rotated about rotation axis R3 to drive the semiconductor wafer 5 to rotate.

In some embodiments, as shown in FIG. 1, the cleaning brush 10 includes a core 20 and a brush member 40. As shown in FIG. 2, the brush member 40 surrounds the core 20 and includes a number of nodules 41 arranged along the entire length of the brush member 40. The length L0 of the brush member 40 may be greater than a diameter W0 of the semiconductor wafer 5, and the brush member 40 may be positioned across the semiconductor wafer 5 during the cleaning process, so that both a central portion of a semiconductor wafer 5 and a peripheral portion of the semiconductor wafer 5 are cleaned with nodules 41 of the brush member 40. However, it will be appreciated that many variations and modifications can be made to embodiments of the disclosure. In some other embodiments, the length of the brush member 40 is less than the diameter W0 of the semiconductor wafer 5, and multiple brush members 40 are used to clean the top and bottom surfaces of a semiconductor wafer 5.

In some embodiments, as shown in FIG. 2, the post-CMP cleaning module 1 further includes a liquid tank 2 and a liquid line 4. Cleaning liquid 6, such as surfactant and/or de-ionized water, are supplied from a liquid source 2 to an inlet port 29 of cleaning brushes 10 via the liquid line 4. The cleaning liquid 2 flows along the core 20 and is evenly distributed throughout the surface of the semiconductor wafer 5 via multiple holes (which will be illustrated in detail with reference to FIGS. 3 and 4) formed on the core 20, as indicated by the arrows 6 shown in FIG. 1.

Detailed structures of the core 20 of the cleaning brush 1, in accordance with one exemplary embodiment, are described below.

Figure 3:
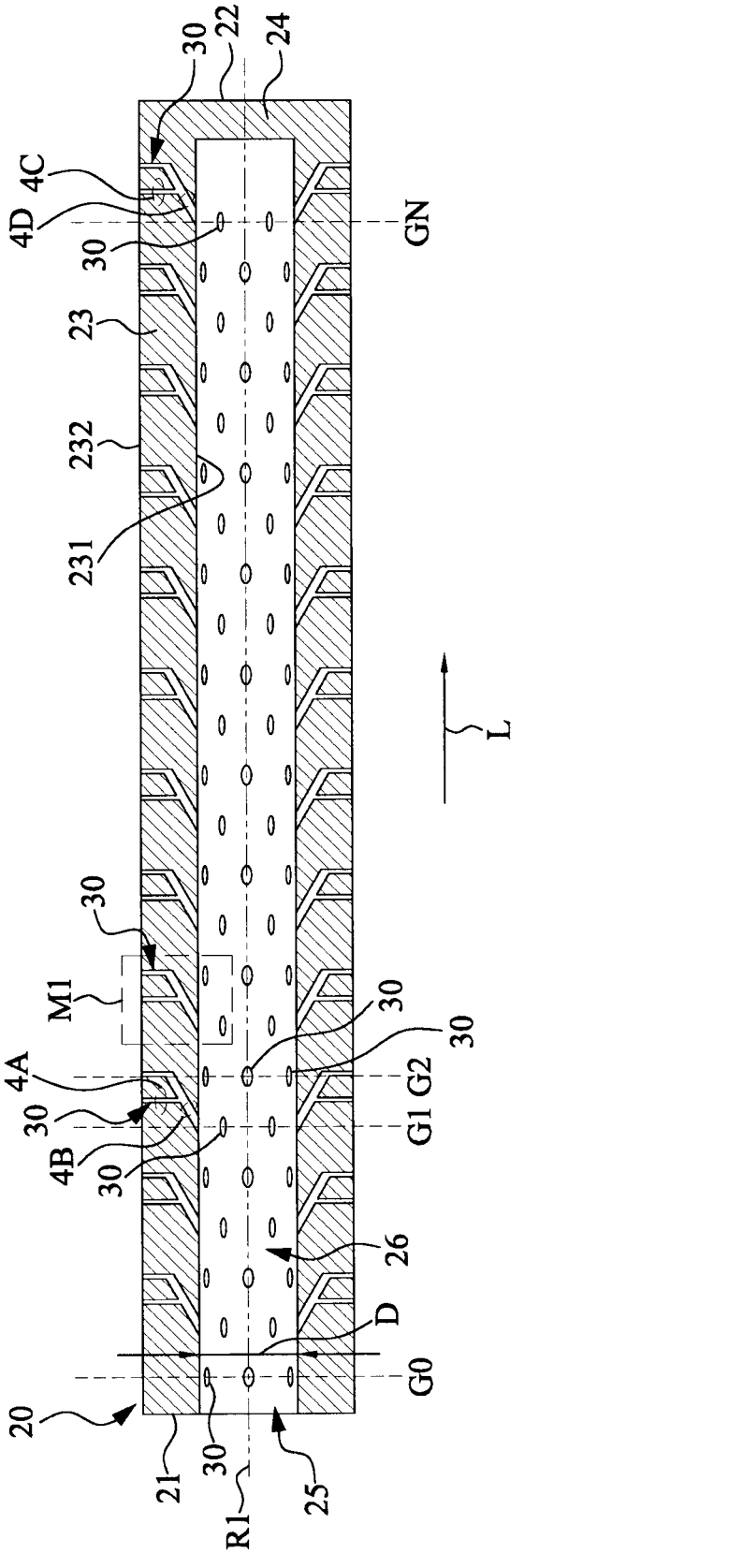
FIG. 3 is a longitudinal perspective section view of a cleaning brush in accordance with a first example embodiment.

FIG. 3 is a longitudinal perspective section view of the cleaning brush 1 in accordance with a first example embodiment. For the purpose of description, the brush member 40 of the cleaning brush 1 is not shown in FIG. 3. In one illustrative embodiment, the core 20 has a first end 21 and a second end 22 opposite to the first end 21 in a longitudinal direction L of the core 20. The core 20 includes a circumferential portion 23 around the rotation axis R1 of the core 20 to form a hollow cylindrical shape. An elongated conduit 26 is defined by an inner surface 231 of the circumferential portion 23. The elongated conduit 26 allows a flow of cleaning liquid along the longitudinal direction L of the core 20. The elongated conduit 26 may have a circular cross-section with its center aligning the rotation axis R1 of the core 20. Alternatively, the elongated conduit 26 may have a polygonal cross-section with edges being arranged in mirror symmetry relative to the rotation axis R1 of the core 20.

An inlet opening 25 is formed at the first end 21 for allowing entry of cleaning liquid into the elongated conduit 26. A separate inlet port, such as inlet port 29 shown in FIG. 2, is connected to the inlet opening 25 to facilitate the engagement of the fluid line 4 to the inlet opening 25. The inlet port 29 may be bonded to the core 20 by thermal energy, fusion, adhesive, or snap fit into the inlet opening 25. With such arrangement, the core 20 can be used in a variety of process tools having different drive ends and/or fluid inlets while using a single mold to make the core 20 without the change to the end fittings.

The core 20 further includes a closed end portion 24 which connects to the circumferential portion 23 at the second end 22 of the core 20. The second end 22 of the core 20 is sealed or closed by the closed end portion 24, and thus no cleaning liquid is allowed to pass through the second end 22 of the core 20. However, it will be appreciated that many variations and modifications can be made to embodiments of the disclosure. In some other embodiments, both the first end 21 and the second end 22 of the core 20 are open, and cleaning liquid is supplied into the core 20 through two ends of the cores. Alternatively, the cleaning liquid enters the core 20 via an opening formed at the first end of the core 20 and leaves the core 20 via the other opening formed at the second end of the core 20.

A number of outlet channels 30 are formed in the circumferential portion 23 of the core 20 and are configured to discharge cleaning liquid from the elongated conduit 26 to the brush member 40 (FIGS. 1 and 2) which surrounds the core 20. Each of the outlet channels 30 passes through the circumferential portion 23 of the core 20 and extends from the inner surface 231 to the outer surface 232 of the circumferential portion 23. A number of groups of the outlet channels 30 are arranged in order along the longitudinal direction L of the core 20 in a constant pitch or in varied pitches. The outlet channels 30 of each group are arranged around the rotation axis R1 of the core 20. According to one exemplary embodiment of the present disclosure, there are 144 outlet channels 30 formed in the circumferential portion 23 of the core 20, and every six outlet channels 30 are grouped together. For example, as shown in FIG. 3, groups G0, G1, G2 and GN each consist of six outlet channels 30 that are arranged around the rotation axis R1 of the core 20.

Figure 4:
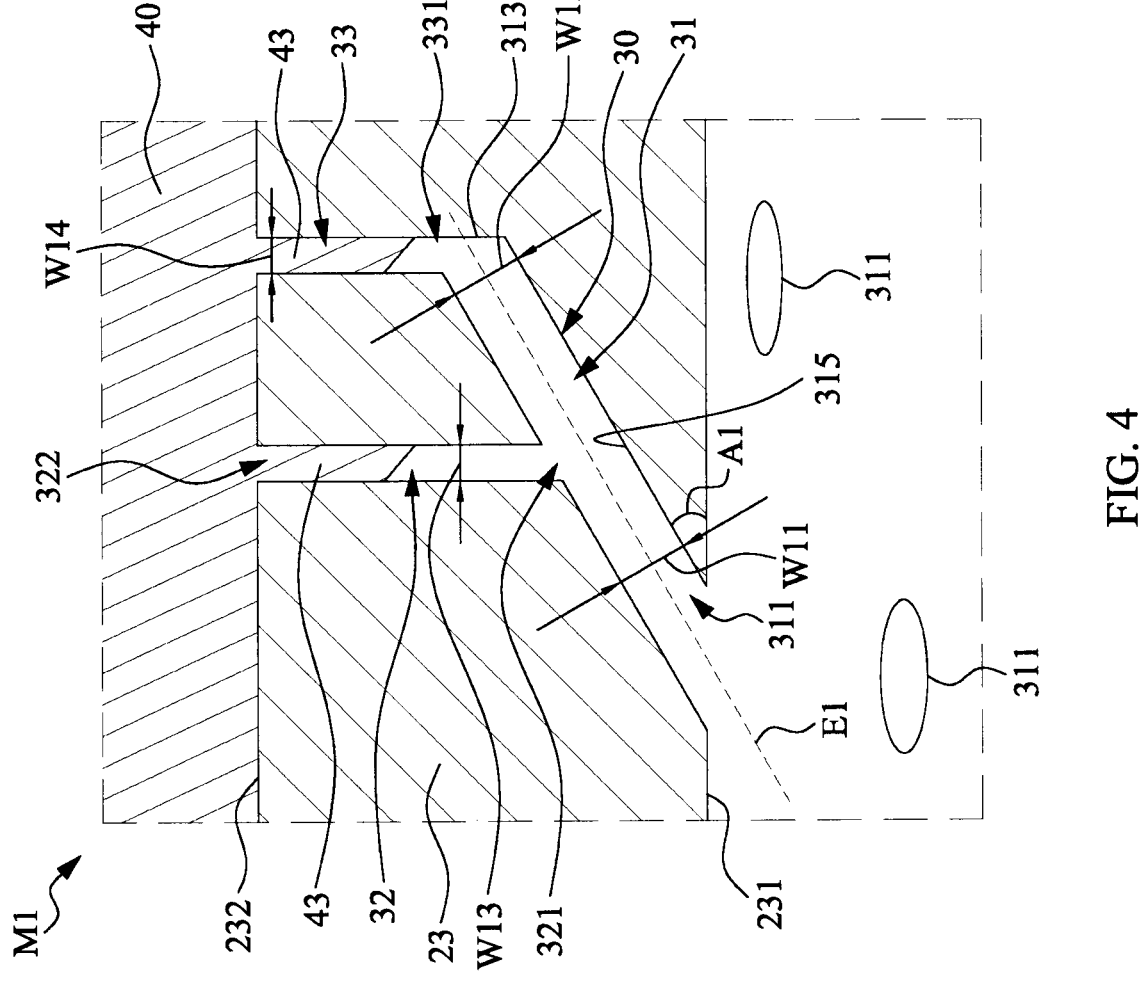
FIG. 4 is an enlarged view of a region M1 of FIG. 3 as a brush member covers the outer surface of the core.

FIG. 4 is an enlarged view of a region M1 of the core 20 shown in FIG. 3 with the brush member 40 covering the outer surface 232 thereof. In some embodiments, each of the outlet channels 30 has an upstream section 31, and two or more downstream sections, such as first downstream section 32 and second downstream section 33. The upstream section 31 extends from the inner surface 231 of the core 20 and terminates at a distal end 313. The end of the upstream section 31 that is formed at the inner surface 231 of the core 20 defines an inlet hole 311 of the outlet channel 30. The distal end 313 is distant from and not connected to the outer surface 232 of the core 20.

In some embodiments, the upstream section 31 of the outlet channel 30 is outwardly tilted toward the closed end portion 24 (FIG. 3). Specifically, as shown in FIG. 4, an inner wall 315 of the upstream section 31 is inclined relative the inner surface 231 of the circumferential portion 23 with a tilt angle A1. The tilt angle A1 may be in a range of about 20 degrees to about 80 degrees, preferably in a range of about 30 degrees to about 60 degrees. In one exemplary embodiment, the tilt angle A1 is about 45 degrees. As shown in FIG. 4, due to the inclined arrangement, the inlet holes 311 of the outlet channels 30 have oval shapes. The purpose of tilting outlet channels 30 toward the closed end portion (i.e., aligning with the direction of flow) is to reduce resistance to the flow of fluid in the core 20 so that more flow volume exits out of the outlet channels 30 as compared with the outlet channels being perpendicular to the direction of flow.

In some embodiments, the tilt angle A1 of the outlet channels 30 that is close to the closed end portion 24 becomes steeper than that of the outlet channels 30 that is close to the inlet opening 25. For example, the outlet channels 30 in the group G0 that are closest to the inlet opening 25 are tilted relative the inner surface 231 of the circumferential portion 23 by a first angle, and the outlet channels 30 in the group GN that are closest to the close end portion 24 are tilted relative the inner surface 231 of the circumferential portion 23 by a second angle. The second angle is greater than the first angle. In one exemplary embodiment, while not illustrated in FIG. 3, the first angle is about 20 degrees and the second angle is about 80 degrees. With such arrangement, the uniformity of fluid distribution in the core 20 may be further improved.

The first downstream section 32 and the second downstream section 33 of the outlet channels 30 are connected to the upstream section 31 at their inner ends 321 and 331. The first downstream section 32 and the second downstream section 33 extend from the inner ends 321 and 331, respectively, along a direction that is perpendicular to the outer surface 232 of the core 20, and terminate at outlet holes 322 and 332 formed at the outer surface 232 of the core 20. In some embodiments, the inner end 321 of the first downstream section 32 intersects a middle point of the upstream section 31, and the inner end 331 of the second downstream section 33 intersects the distal end 313 of the upstream section 31.

In some embodiments, the outlet channels 30 have a varying cross section along their lengths. For example, the width of the upstream section 31 of the outlet channels 30 are tapered along its extending direction. Specifically, as shown in FIG. 4, the upstream section 31 has a first width W11 at the inlet hole 311 and has a second width W12 at the distal end 313, and the first width W11 and the second width W12 are perpendicular to an extension axis E1 of the upstream section 31. The second width W12 is less than the first width W11. In another exemplary embodiment, the width W13 of the downstream section 32 and the width W14 of the second downstream section 33 are less than the width W11 or W12 of the upstream section 31. The width W13 of the downstream section 32 and the width W14 of the second downstream section 33 may be different. For example, the width W13 of the downstream section 32 may be narrower than the width W14 of the second downstream section 33.

It should be appreciated that the width of the outlet channels 30 and the number of the outlet channels 30 may be varied and should not be limited to the above embodiments. In some embodiments, for a better uniformity of fluid distribution, Murray's law is applied to the design of a width D (FIG. 3) of the elongated conduit 26, the first width W11 of the upstream section 31, and the width W13 or the width W14 of the downstream sections 32 and 33. For example, widths D, W11, W13 and W14 stratified the following equations (1) and (2):

$$D^3 = \Sigma_{k=0}{}^n k(W11)^3 \tag{1}$$

$$(W11)^3 = \Sigma_{i=0}{}^n i(W13)^3 + \Sigma_{j=0}{}^n j(W14)^3 \tag{2}$$

where k is the total number of the upstream sections 31, and i is the total number of the downstream sections 32, and j is the total number of the downstream sections 33.

Figures 4A, 4B, 4C, 4D:
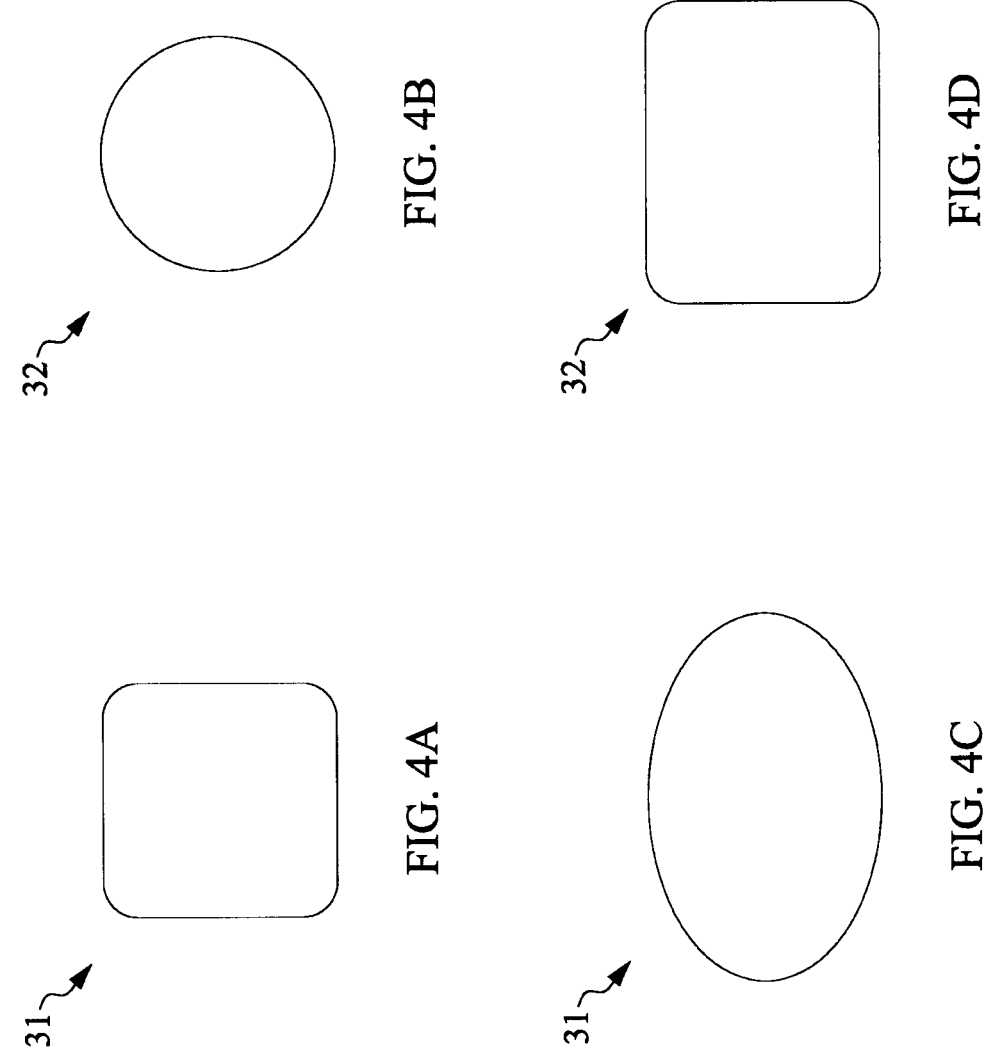
FIG. 4A is a traversal perspective section view of the outlet channel taken along line 4A of FIG. 3.
FIG. 4B is a traversal perspective section view of the outlet channel taken along line 4B of FIG. 3.
FIG. 4C is a traversal perspective section view of the outlet channel taken along line 4C of FIG. 3.
FIG. 4D is a traversal perspective section view of the outlet channel taken along line 4D of FIG. 3.

In some embodiments, a cross-sectional shape of an upstream section is different from a cross-sectional shape of a downstream section of the outlet channel. For example, as shown in FIGS. 4A and 4B, the upstream section 31 of the outlet channel 30 in the group G1 (FIG. 3) may have a circular shape and the downstream section 32 in the corresponding outlet channel may have a rectangular shape. In some embodiment, the outlet channels 30 in different groups may have different cross-sectional shapes. For example, as shown in FIGS. 4C and 4D, the upstream section 31 of the outlet channel 30 in the group GN (FIG. 3) may have a rectangular shape and the downstream section 32 of the corresponding outlet channel 30 may have an elliptical shape. That is, the outlet channel 30 in group GN has a shape which is different from that of the outlet channel 30 in group G1.

Figure 4E:
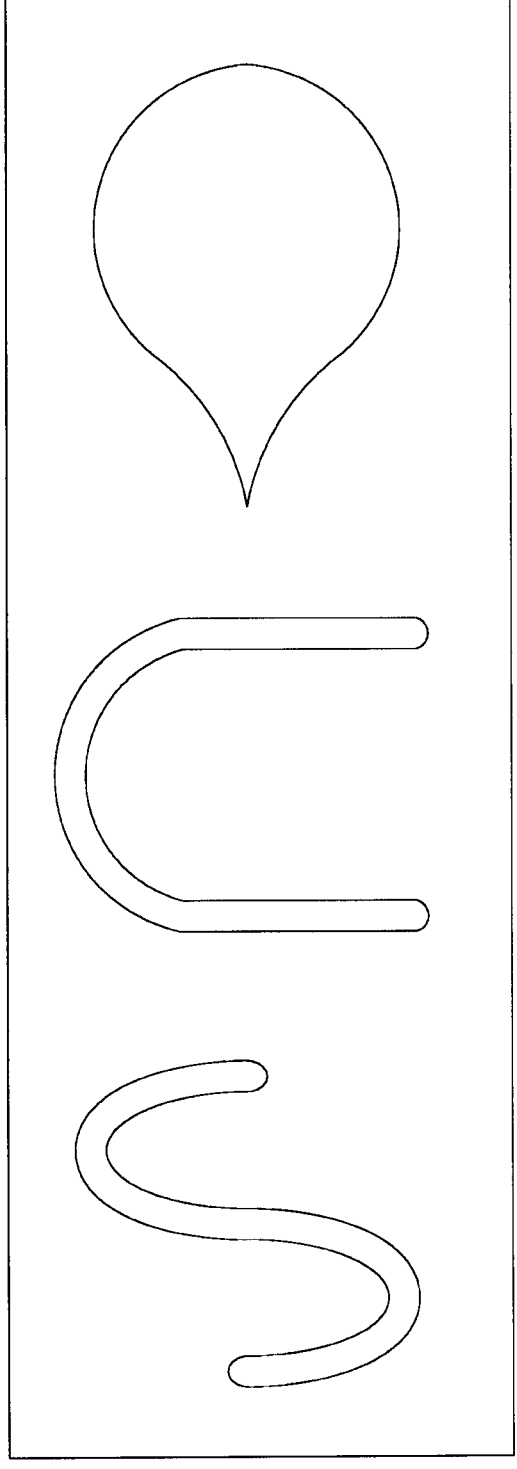
FIG. 4E shows varied configurations of outlet channels of a core, in accordance with some embodiments.
Figure 4E:
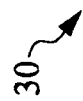

In some embodiments, geometry, shape and size of the outlet channels 30 can be selectively varied along the length of the core 20 as long as a uniform pressurization can be obtained. The cross-sectional shape of the outlet channels 30 may be selected from regular shapes, such as those shown in FIGS. 4A-4D, irregular shapes and/or non-prismatic shapes, e.g., S-shape, U-shape, droplet shape as shown in FIG. 4E, or any other suitable shapes. Furthermore, in cases where the outlet channel has a rectangular shape, ratios of breadth and length of a rectangular channel can be derived which satisfy flow requirements and pressurization goals for a post-CMP cleaning process.

In some embodiments, the outlet channels 30 in two adjacent groups are arranged in a staggered manner. For example, as shown in FIG. 3, the first group G1 of the outlet channels 30 is immediately located adjacent to the second group G2 of the outlet channels 30. The outlet channels 30 in the first group G1 are offset from the outlet channels 30 in the second group G2. However, the present disclosure should not be limited to the above embodiment. The outlet channels 30 in two neighboring groups can align with one another in the longitudinal direction L of the core 20.

The core 20 may be made from any chemically inert polymeric material, such as polymer, copolymers, other materials useful in CMP cleaning processes and the like. In some embodiments, the core 20 is manufactured by 3-dimensional printing techniques, and the material used for the core 20 may be, for example, acrylonitrile butadiene styrene (ABS) or polycarbonate. In some embodiments, while a high ratio of open surface area is provided in the core 20, the core 20 still has a sufficient stiffness, and one of ordinary skill in the art of CMP is capable of selecting a stiffness to achieve a desired cleaning result depending on the composition of the semiconductor substrate, the contaminant or a combination thereof.

The brush member 40 is formed on the outer surface 232 of the core 20 and covers all of the outlet holes 322 and 332 of the outlet channels 30. In one exemplary embodiment, the brush member 40 is made of or includes polyvinyl alcohol (PVA) or other suitable materials, which is applied on the outer surface 232 of the core 20 in a liquid form and then is cured. During the formation of the brush member 40, a portion 43 of the material of the brush member 40 may flow into and seal the first and second downstream sections 32 and 33 of the outlet channels 30, as shown in FIG. 4. Due to the small width of the first and second downstream sections 32 and 33 of the outlet channels 30, the first and second downstream sections 32 and 33 are partially filled with the material of the brush member 40, and the upstream section 31 is free of the material of the brush member 40. However, it will be appreciated that many variations and modifications can be made to the embodiments of the disclosure. In some other embodiments, the first and second downstream sections 32 and 33 are entirely filled with the material of the brush member 40, and the upstream section 31 are partially filled with the material of the brush member 40.

Figure 5:
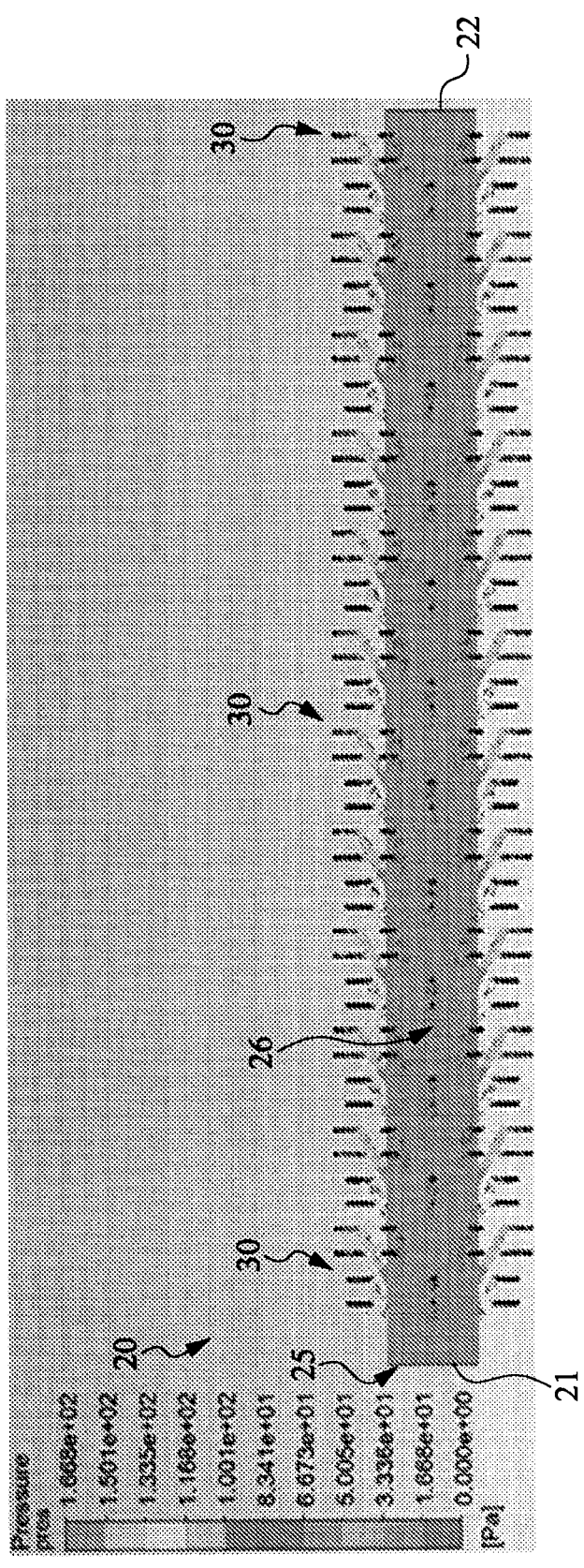
FIG. 5 is a simulation result of a liquid pressure distribution in the core of FIG. 3.

FIG. 5 is a simulation result of a liquid pressure distribution in the core 20 of FIG. 3. A simulation was performed to obtain pressure distribution across the entire length of the core 20 when the flow of a cleaning liquid is supplied into the core 20 via the inlet opening 25 formed at the first end 21 of the core 20. By following Murray's law, the biomimicked design of the core 20 ensures a minimal pressure drop of the fluid along the length of the core 20 and exhibits an extraordinary uniformity of pressure distribution of fluid within the elongated conduit 26 of the core 20. As a result, the pressure of the fluid exiting the outlet channels 30 is substantially uniform, and a large area of the brush member 40 that covers the outlet channels is sufficiently rinsed by the cleaning liquid, thereby increasing the cleaning efficiency of the brush member 40 or of the semiconductor wafer to be cleaned by the cleaning brush 1. Compared with a conventional core which includes outlet channels, perpendicularly extending relative to the rotation axis, across the entire length thereof, the embodiments of the present disclosure exhibit a greater outlet volume at a proximal end of the core and a smaller outlet volume at a distal end of the core.

The configuration of the core of the cleaning brush 1 surrounded by the brush member 40 should not be limited to the embodiments above. Some exemplary embodiments of the core are described below.

Figure 6:
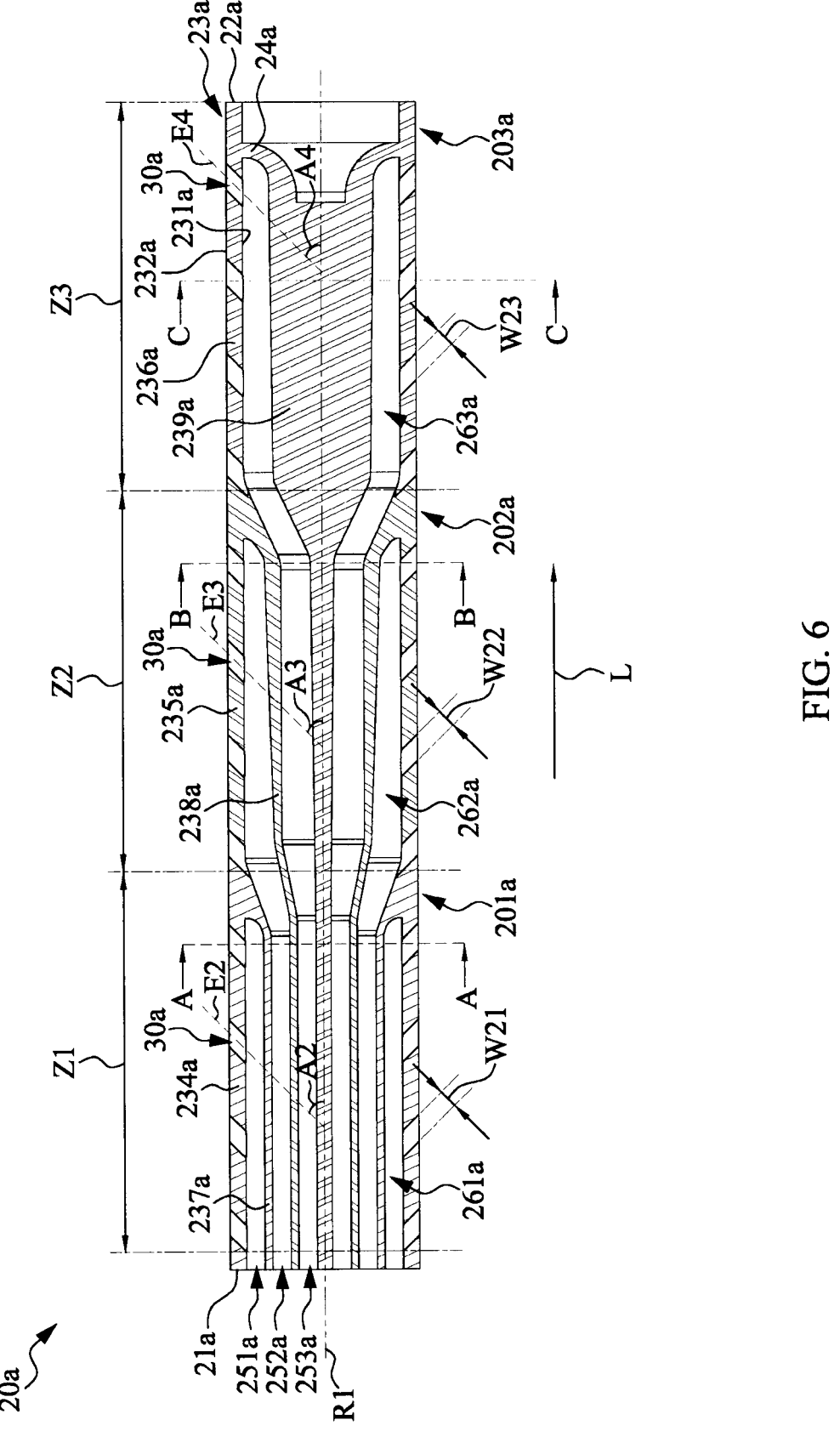
FIG. 6 is a longitudinal perspective section view of a core in accordance with a second example embodiment.

FIG. 6 is a longitudinal perspective section view of a core 20a in accordance with a second example embodiment. In one illustrative embodiment, the core 20a has a first end 21a and a second end 22a opposite to the first end 21a in a longitudinal direction L of the core 20a. A number of inlet openings, such as first inlet opening 251a, second inlet opening 252a and third inlet opening 253a, are defined at the first end 21a of the core 20a for allowing entry of cleaning liquid into different conduits in the core. The first inlet opening 251a, the second inlet opening 252a and the third inlet opening 253a are arranged adjacent to each other and concentrically arranged relative to a rotation axis R1 of the core 20a. The first inlet opening 251a, the second inlet opening 252a and the third inlet opening 253a may have the same width in a radial direction of the core 20a.

In some embodiments, the core 20a includes multiple separate structures which are telescoped with one another. In one exemplary embodiment, the core 20a includes a first member 201a, a second member 202a and a third member 203a. The first member 201a, the second member 202a and the third member 203a include a first sub-segment wall 234a, a second sub-segment wall 235a, and a third sub-segment wall 236a, respectively. The first sub-segment wall 234a, the second sub-segment wall 235a, and the third sub-segment wall 236a each have a ring shape and are sequentially arranged along the longitudinal direction L from the first end 21a to the second end 22a of the core 20a so as to cooperatively construct a circumferential portion 23 of the core 20 on which the brush member 40 (FIG. 1) is formed.

Moreover, the first member 201a, the second member 202a and the third member 203a include a first fluid guiding portion 237a, a second fluid guiding portion 238a and a third fluid guiding portion 239a, respectively, for defining multiple elongated conduits in the core 20a. Specifically, the first fluid guiding portion 237a is connected to an inner surface of the first sub-segment wall 234a and extends from a distal end of the first sub-segment wall 234a, which is immediately adjacent to the second sub-segment wall 235a, to the first inlet opening 251a. A first elongated conduit 261a is defined between the first sub-segment wall 234a and the first fluid guiding portion 237a and fluidly communicated with the first inlet opening 251a.

The second fluid guiding portion 238a is connected to an inner surface of the second sub-segment wall 235a and extends from a distal end of the second sub-segment wall 235a, which is immediately adjacent to the third sub-segment wall 236a, to the second inlet opening 252a. An upstream of a second elongated conduit 262a is defined between the first fluid guiding portion 237a and the second fluid guiding portion 238a, and a downstream of the second elongated conduit 262a is defined between the second fluid guiding portion 238a and the second sub-segment wall 235a. The second elongated conduit 262a is fluidly communicated with the second inlet opening 252a.

The third fluid guiding portion 239a is connected to an inner surface of the third sub-segment wall 236a and extends from a distal end of the third sub-segment wall 236a, which is adjacent to the second end 22a of the core 20a, to the third inlet opening 253a. An upstream of a third elongated conduit 263a is defined between the second fluid guiding portion 238a and the third fluid guiding portion 239a, and a downstream of the third elongated conduit 263a is defined between the third fluid guiding portion 239a and the third sub-segment wall 236a. The third fluid guiding portion 239a is fluidly communicated with the third inlet opening 253a. A closed end portion 24a of the core 20a is defined by a portion of third fluid guiding portion 239a that is connected to the third sub-segment wall 236a. The first fluid guiding portion 237a, the second fluid guiding portion 238a and the third fluid guiding portion 239a may be formed with a streamlined shape, as shown in FIG. 6 so as to reduce impedance of fluid in the core 20a.

A number of outlet channels 30a are formed at the first sub-segment wall 234a, the second sub-segment wall 235a, and the third sub-segment wall 236a and configured to discharge cleaning liquid from the first, second and third elongated conduits 261a, 262a and 263a to the brush member which surrounds the core 20a. Each of the outlet channels 30a passes through the circumferential portion 23a of the core 20a and extends from the inner surface 231a to the outer surface 232a of the circumferential portion 23a.

Figure 7:
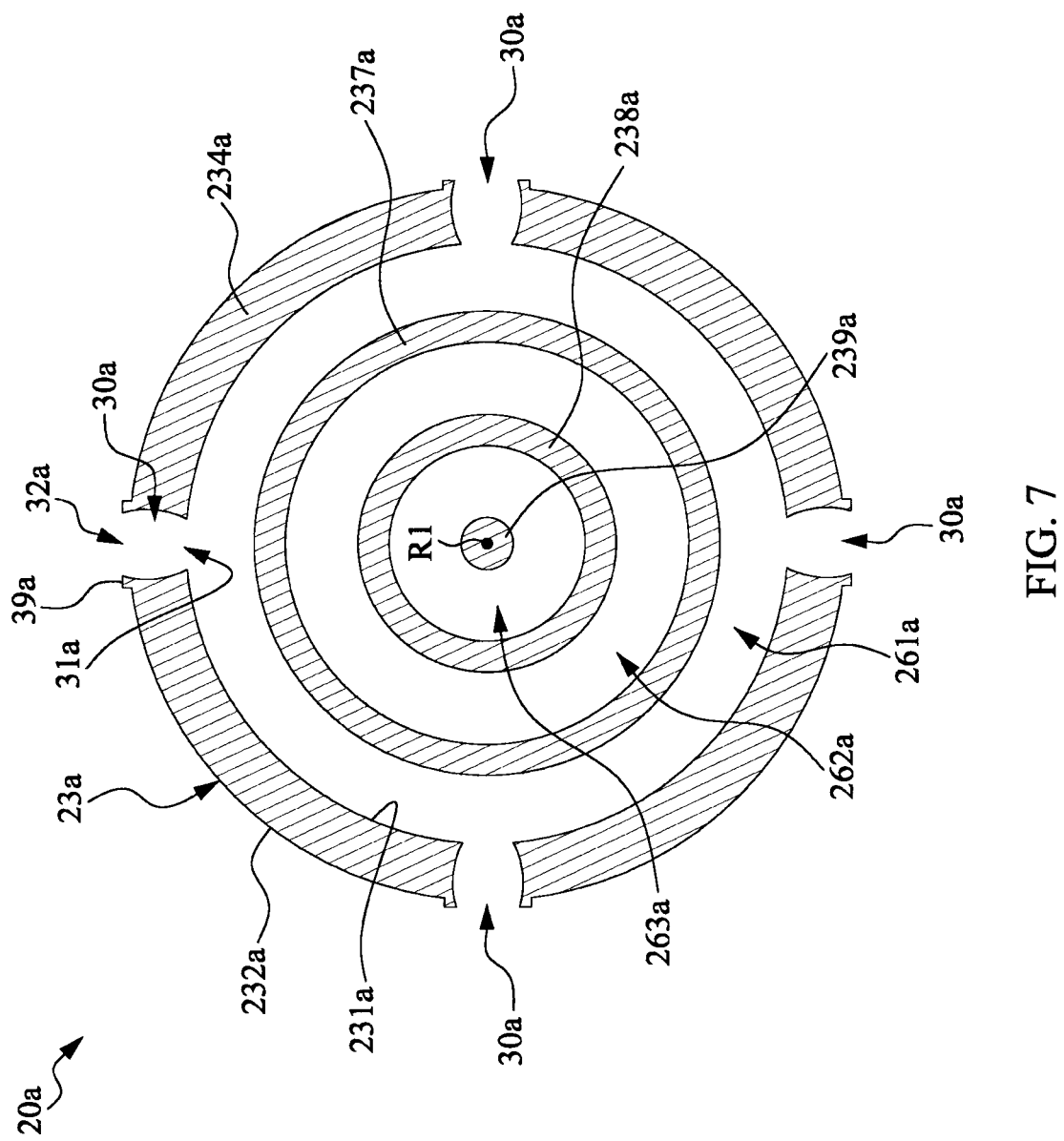
FIG. 7 is a traversal perspective section view of the core taken along line A-A of FIG. 6.
Figure 8:
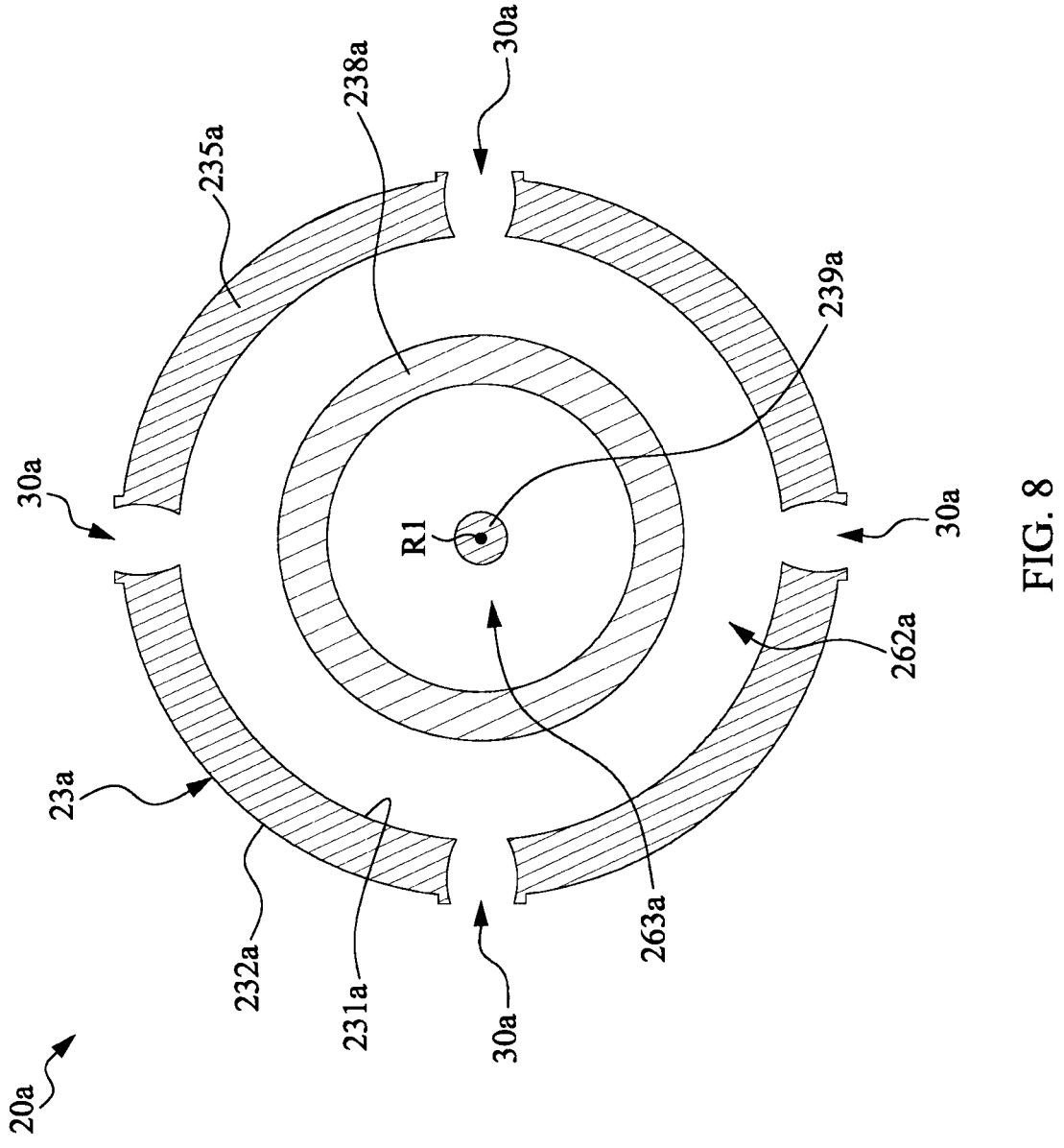
FIG. 8 is a traversal perspective section view of the core taken along line B-B of FIG. 6.
Figure 9:
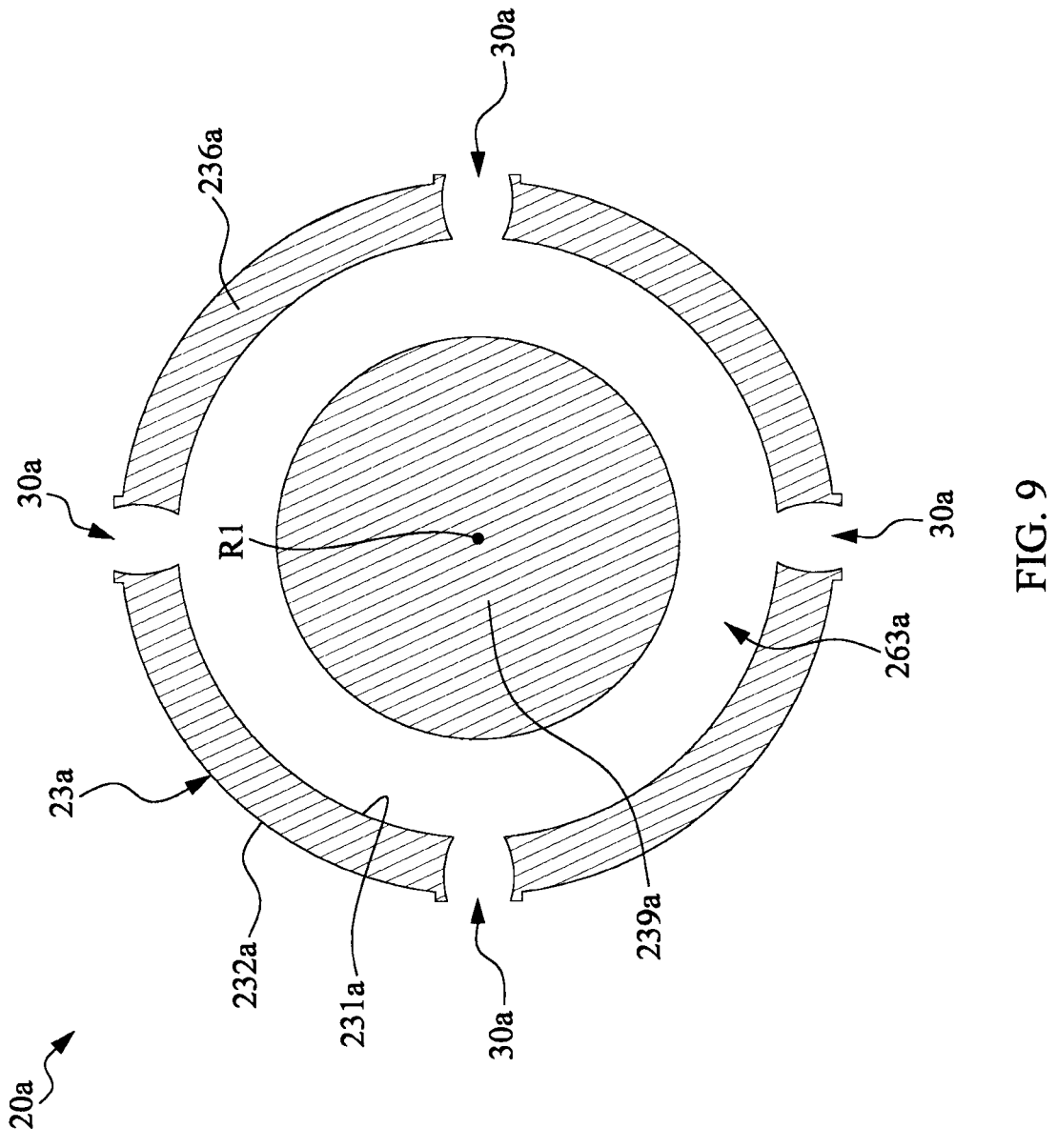
FIG. 9 is a traversal perspective section view of the core taken along line C-C of FIG. 6.

A number of groups of the outlet channels 30a are arranged along the longitudinal direction L of the core 20a in fixed or varied pitches, and the outlet channels 30a in each group are arranged around the rotation axis R1 of the core 20a. Arrangements of the outlet channels 30a in each of the first member 201a, the second member 202a and the third member 203a are shown in FIGS. 7, 8 and 9, which show traversal perspective section views of the core 20a taken along lines A-A, B-B and C-C, respectively, of FIG. 6. In one exemplary embodiment, as shown in FIGS. 7, 8 and 9, each of the groups of outlet channels that is arranged around the rotation axis R1 consists of four outlet channels 30a formed in the first sub-segment wall 234a, the second sub-segment wall 235a, and the third sub-segment wall 236a. As shown in FIG. 7, two ends of the outlet channels 30a form an inlet hole 31a and an outlet hole 32a on the inner surface 231a and the outlet surface 232a of the core 23a. In some embodiments, a flange 39a is formed at and surrounds the outlet hole 32a.

With reference to FIG. 6, in some embodiments, the outlet channels 30a are outwardly tilted toward the closed end portion 24a. Specifically, the outlet channels 30a formed at the first sub-segment wall 234a each extend in an extension axis E2 and are inclined relative the inner surface 231a of the circumferential portion 23a with a tilt angle A2. The outlet channels 30a formed at the second sub-segment wall 235a each extend in an extension axis E3 and are inclined relative the inner surface 231a of the circumferential portion 23a with a tilt angle A3. The outlet channels 30a formed at the third sub-segment wall 236a each extend in an extension axis E3 and are inclined relative the inner surface 231a of the circumferential portion 23a with a tilt angle A3. The tilt angles A2, A3 and A4 may be in a range of about 20 degrees to about 90 degrees, preferably in a range of about 30 degrees to about 60 degrees. In one exemplary embodiment, the tilt angles A2, A3 and A4 are about 45 degrees. The purpose of having outlet channels 30a tilted toward the closed end portion (i.e., aligning with the direction of flow) is to reduce resistance to the flow of fluid in the core 20a so that more flow volume exits out of the outlet channels 30a as compared with outlet channels being perpendicular to the direction of flow.

In some embodiments, the tilt angle of the outlet channels 30a that is close to the closed end portion 24a becomes steeper than that of the outlet channels 30a that is close to the inlet openings 251a, 252a and 253a. For example, the tilt angle A4 of the outlet channels 30a formed at the third sub-segment wall 236a is greater than the tilt angle A3 of the outlet channels 30a formed at the second sub-segment wall 235a, and the tilt angle A3 of the outlet channels 30a is greater than the tilt angle A2 of the outlet channels 30a formed at the first sub-segment wall 234a. In one exemplary embodiment, while not illustrated in FIG. 6, the tilt angle A2 is about 20 degrees, the tile angle A3 is about 45 degrees and the tilt angle A4 is about 90 degrees. With such arrangement, the uniformity of fluid distribution in the core 20*a* may be further improved.

In some embodiments, the outlet channels 30*a* have varying cross sections along their lengths. In one exemplary embodiment, as shown in FIG. 7, the outlet channel 30*a* has a spindle-like cross section with a width of a middle section of the outlet channels 30 being greater than a width of the inlet hole 31*a* or a width of the outlet hole 32*a*. It should be appreciated that the width of the outlet channels 30*a* and the number of the outlet channels 30*a* may be varied and should not be limited to the above embodiments. Geometry, shape and size of the outlet channels 30*a* can selectively be varied along the length of the core 20*a* as long as a uniform pressurization can be obtained. In cases where the outlet channel has a rectangular shape, ratios of breadth and length of the rectangular channel can be derived which satisfy flow requirements and pressurization goals for a post-CMP cleaning process.

In some embodiments, a first zone Z1, a second zone Z2 and a third zone Z3 of the core 20*a* are defined in order along a direction from the inlet opening 251*a*, 252*a* and 253*a* to the closed end portion 24*a*. The first zone Z1 corresponds to a segment of the core 20*a* where the outlet channels 30*a* of the first sub-segment wall 234*a* are located. The second zone Z2 corresponds to a segment of the core 20*a* where the outlet channels 30*a* of the second sub-segment wall 235*a* are located. The third zone Z3 corresponds to a segment of the core 20*a* where the outlet channels 30*a* of the third sub-segment wall 236*a* are located.

In some embodiments, a total volume, in unit length, of the elongated conduit and the outlet channels within the respective first, second and third zones Z1, Z2 and Z3 gradually decreases. Specifically, as shown in FIG. 7, the core 20*a* in the first zone Z1 includes four outlet channels 30*a* and three elongated conduits 261*a*, 262*a* and 263*a*. The core 20*a* in the second zone Z2 includes four outlet channels 30*a* and two elongated conduits 262*a* and 263*a*. The core 20*a* in the third zone Z3 includes four outlet channels 30*a* and one elongated conduit 263*a*. As a result, a total volume, in unit length, of the elongated conduit in the first zone Z1 is greater than that in the second zone Z2, and a total volume, in unit length, of the elongated conduit in the second zone Z2 is greater than that in the third zone Z3.

The core 20*a* may be made from any chemically inert polymeric material, such as polymer, copolymers, other materials useful in CMP cleaning processes and the like. In some embodiments, the core 20*a* is manufactured by 3-dimensional printing techniques, and the material used for the core 20*a* may include, for example, acrylonitrile butadiene styrene (ABS) or polycarbonate. In some embodiments, while the core 20*a* includes a number of layers telescoped in each other, the core 20*a* still has a sufficient stiffness for maintaining a cleaning uniformity.

Figure 10:
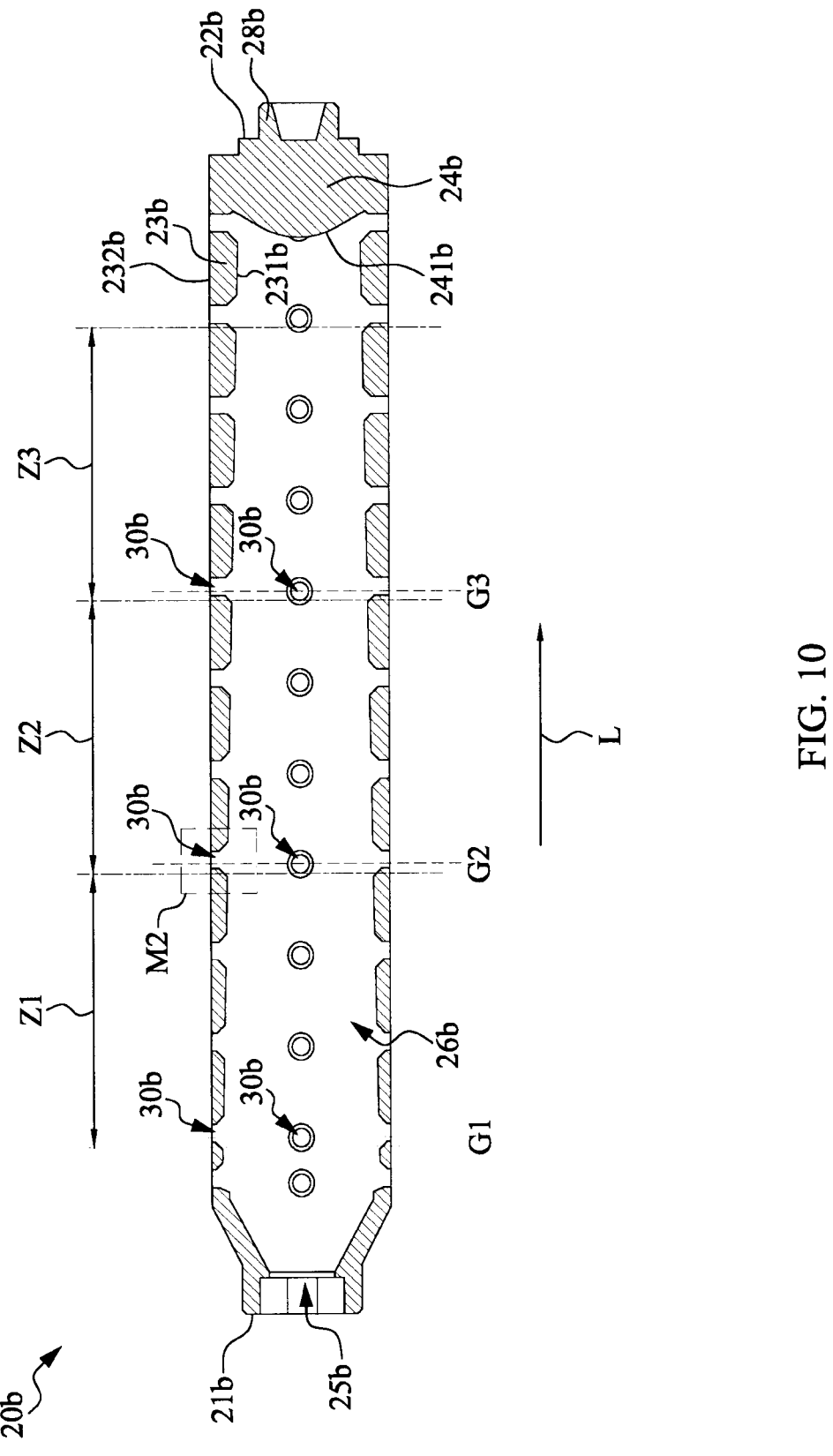
FIG. 10 is a longitudinal perspective section view of a core in accordance with a third example embodiment.

FIG. 10 is a longitudinal perspective section view of a core 20*b* in accordance with a third example embodiment. In one illustrative embodiment, the core 20*b* has a first end 21*b* and a second end 22*b* opposite to the first end 21*b* in a longitudinal direction L of the core 20*b*. The core 20*b* includes a circumferential portion 23*b* around a rotation axis R1 of the core 20*b* to form a hollow cylindrical shape. An elongated conduit 26*b* is defined by an inner surface 231*b* of the circumferential portion 23*b*. The elongated conduit 26*b* allows a flow of cleaning liquid along the longitudinal direction L of the core 20*b*.

An inlet opening 25*b* is formed at the first end 21*b* for allowing entry of cleaning liquid into the elongated conduit 26*b*. The core 20*b* further includes a closed end portion 24*b* which connects to the circumferential portion 23*b* at the second end 22*b* of the core 20*b*. The second end 22*b* of the core 20*b* is sealed by the closed end portion 24*b*, and thus no cleaning liquid is allowed to pass through the second end 22*b* of the core 20*b*. A flange 28*b* may be formed at the outer surface of the closed end portion 24*b* for the connection of the core 20*b* with a tool spindle (not shown in the figures.)

A number of outlet channels 30*b* are formed in the circumferential portion 23*b* of the core 20*b* and configured to discharge cleaning liquid from the elongated conduit 26*b* to the brush member 40 (FIGS. 1 and 2) which surrounds the core 20*b*. Each of the outlet channels 30*b* passes through the circumferential portion 23*b* of the core 20*b* and extends from the inner surface 231*b* to the outer surface 232*b* of the circumferential portion 23*b*. A number of groups of the outlet channels 30*b* are arranged in order along the longitudinal direction L of the core 20*b* in a constant pitch or in varied pitches. The outlet channels 30*b* in each group are arranged around the rotation axis R1 of the core 20*b*. According to one exemplary embodiment of the present disclosure, each of the groups, such as groups G1, G2 and G3, consists of four outlet channels 30*b* (only three outlet channels of each group are shown in FIG. 10) arranged around the rotation axis R1 of the core 20*b*.

In some embodiments, the inner surface 231*b* of the circumferential portion 23*b* is tapered along the longitudinal direction L of the core 20*b* from the inlet opening 25*b* to the closed end portion 24*b*. Therefore, a thickness of the circumferential portion 23*b* gradually increases in a direction away from the inlet opening 25*b*, and the outlet channels 30*b* arranged along the longitudinal direction L have gradually increased volumes. For example, the outlet channels 30*b* of group G3 have a larger volume than that of the outlet channels 30*b* of group G2. In addition, the outlet channels 30*b* of group G2 have a larger volume than that of the outlet channels 30*b* of group G1. In the embodiment shown in FIG. 10, the groups G1, G2 and G3 are three groups of the outlet channels that are arranged in order along the longitudinal direction of the core 20*b*.

Figure 11:
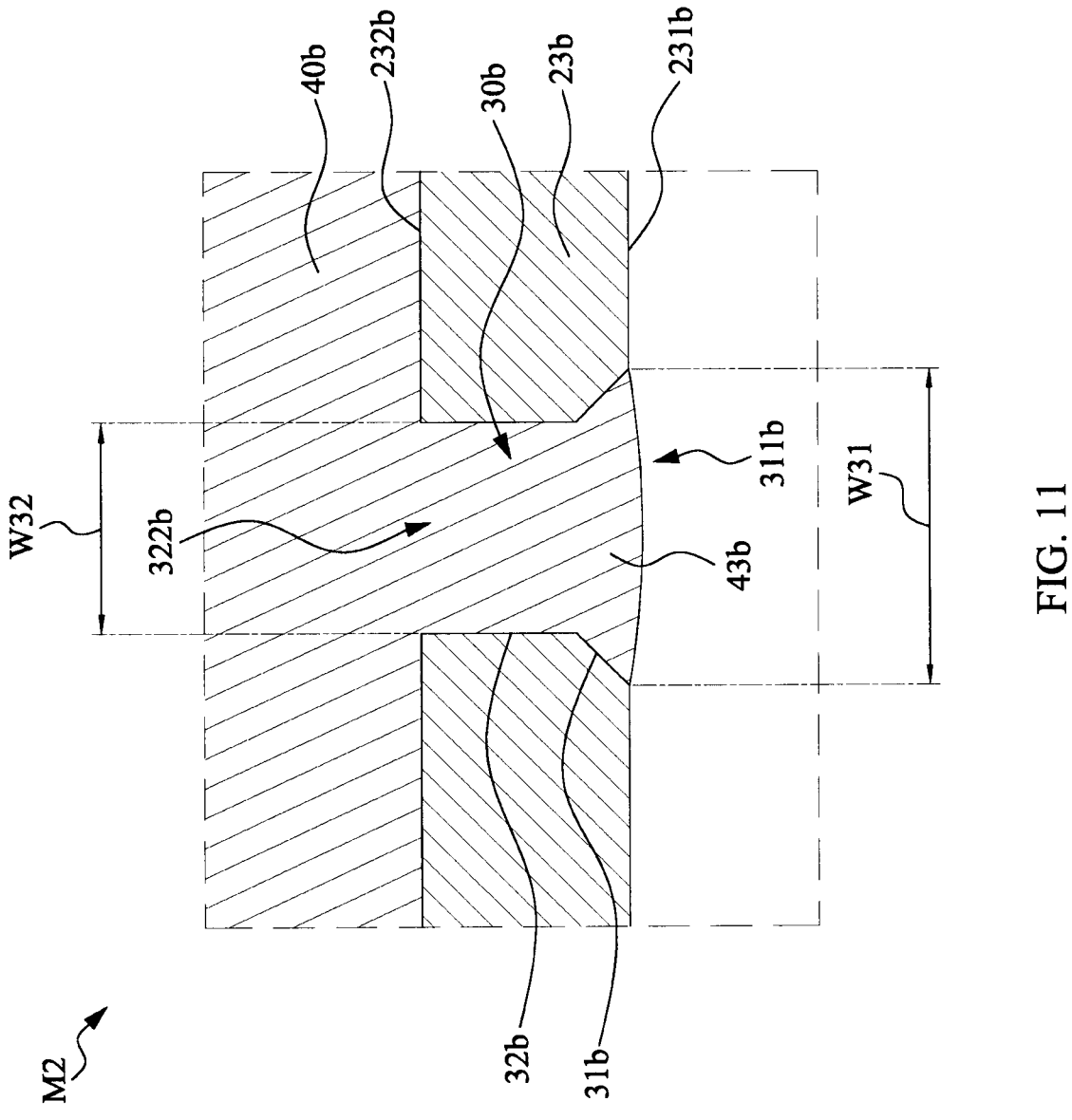
FIG. 11 is an enlarged view of a region M2 of FIG. 10 as a brush member covers the outer surface of the core.

FIG. 11 is an enlarged view of a region M2 of the core 20*b* shown in FIG. 10 with the brush member 40*b* covering the outer surface 232*b* thereof. In some embodiments, each of the outlet channels 30*b* has an upstream section 31*b* and a downstream section 32*b*. The upstream section 31*b* extends from the inner surface 231*b* of the core 20*b* and is connected to the downstream section 32*b*. The end of the upstream section 31*b* that is formed at the inner surface 231*b* of the core 20*b* defines an inlet hole 311*b* of the outlet channel 30*b*. The downstream section 32*b* extends from the outer surface 232*b* of the core 20*b* and is connected to the upstream section 31*b*. The end of the downstream section 32*b* that is formed at the outer surface 232*b* of the core 20*b* defines an outlet hole 322*b* of the outlet channel 30*b*.

In some embodiments, the outlet channels 30*b* have a varying cross section along their lengths. For example, as shown in FIG. 11, the upstream section 31*b* includes a round corner or a chamfer that is tapered outwardly and has an inner wall that is inclined relative to the inner surface 231*b* of the circumferential portion 23*b*. The downstream section 32*b* is perpendicular to the outer surface 232*b* of the circumferential portion 23*b*. As a result, a first width W31 of the inlet hole 311*b* is greater than a second width W32 of the outlet hole 322*b*.

It should be appreciated that the width of the outlet channels 30*b* and the number of the outlet channels 30*b* may be varied and should not be limited to the above embodiments. In addition, geometry, shape and size of the outlet channels 30b can selectively be varied along the length of the core 20b as long as a uniform pressurization can be obtained.

The core 20b may be made from any chemically inert polymeric material, such as polymer, copolymers, other materials useful in CMP cleaning processes and the like, and can be formed by using an injection molding process. In some embodiments, as shown in FIG. 11, the brush member 40b is formed on the outer surface 232b of the core 20b and covers all of the outlet holes 322b of the outlet channels 30b. In one exemplary embodiment, the brush member 40b is applied on the outer surface 232b of the core 20b in a liquid form and then is cured. During the formation of the brush member 40b, the material of the brush member 40b fills the whole volume of the outlet channel 30b. In some embodiments, the brush member 40b includes polyvinyl alcohol (PVA) or other suitable materials. In some embodiments, while the circumferential portion of the core 20b has a varying thickness, the core 20b still has a sufficient stiffness for maintaining a cleaning uniformity.

In some embodiments, as shown in FIG. 10, since the elongated conduit 26b is tapered along the longitudinal direction L of the core 20b, the volume of the elongated conduit 26b in unit length of the core 20b gradually decreases. In some embodiments, a first zone Z1, a second zone Z2 and a third zone Z3 of the core 20b are defined in order along a direction from inlet opening 25b to the closed end portion 24b. The first zone Z1, the second zone Z2 and the third zone Z3 have equal distance in the longitudinal direction L of the core 20b, and each include three groups of outlet channels 30b that are spaced from each other by a constant pitch. With the gradient of flowing volume along the length of the core 20b, more outlet flow can be discharged in a first half of the core, and therefore a uniform fluid distribution can be achieved.

Figure 12:
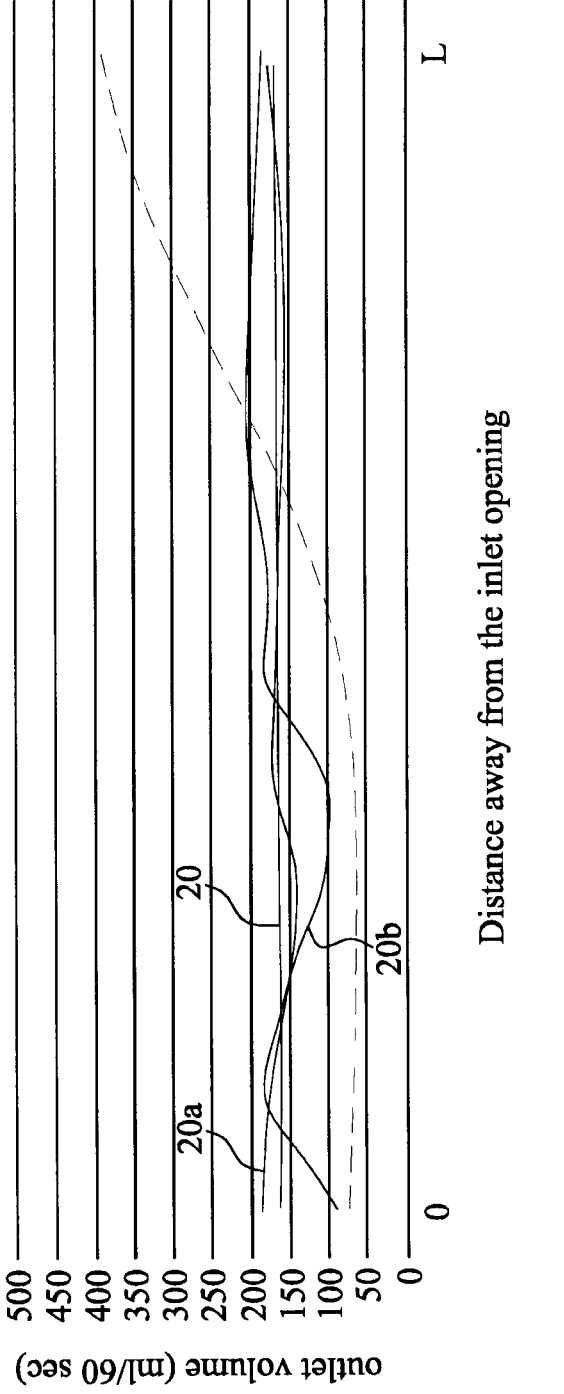
FIG. 12 illustrates simulation results of outlet volume along a length direction of the cores of the first, the second and the third example embodiments of FIGS. 3, 6 and 10.

FIG. 12 is a plot of outlet volume of cleaning liquid from the cores as a function of a distance of the outlet channels away from the inlet opening according to an embodiment of the present disclosure. It appears from FIG. 12 that the core 20 exhibits a constant (stable within +/−5 ml/min) outlet volumes along its length direction. The core 20a exhibits an outlet volume varying between about 145 (ml/min) and about 180 (ml/min) in the first half of its length and reaches stable outlet volume in the second half of its length. While the core 20b exhibits an outlet volume varying between about 95 (ml/min) and about 180 (ml/min) in the first half of its length, it exhibits a stable outlet volume varying between about 180 (ml/min) and about 205 (ml/min) in the second half of its length. In contrast, as shown in dashed lines in FIG. 12, the conventional core exhibits an unacceptable increase in flow towards the closed end thereof.

Figure 13:
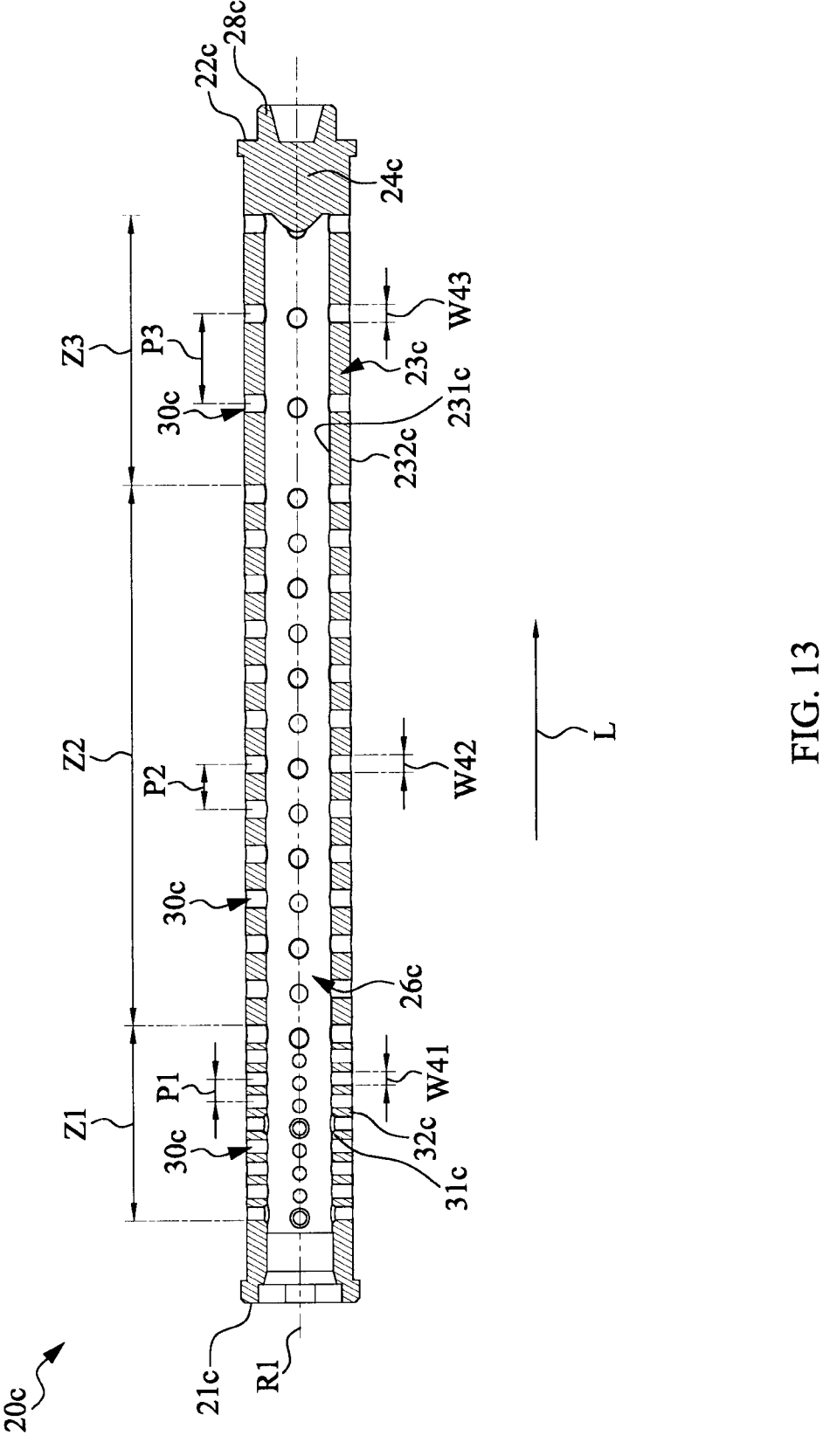
FIG. 13 is a longitudinal perspective section view of a core in accordance with a fourth example embodiment.

FIG. 13 is a longitudinal perspective section view of a core 20c in accordance with a fourth example embodiment. In one illustrative embodiment, the core 20c has a first end 21c and a second end 22c opposite to the first end 21c in a longitudinal direction L of the core 20c. The core 20c includes a circumferential portion 23c around a rotation axis R1 of the core 20c to form a hollow cylindrical shape. An elongated conduit 26c is defined by an inner surface 231c of the circumferential portion 23c. The elongated conduit 26c allows a flow of cleaning liquid along the longitudinal direction L of the core 20c.

An inlet opening 25c is formed at the first end 21c for allowing entry of cleaning liquid into the elongated conduit 26c. The core 20c further includes a closed end portion 24c which connects to the circumferential portion 23c at the second end 22c of the core 20c. The second end 22c of the core 20c is sealed by the closed end portion 24c, and thus no cleaning liquid is allowed to pass through the second end 22c of the core 20c. A flange 28c may be formed at the outer surface of the closed end portion 24c for the connection of the core 20c with a tool spindle (not shown in the figures.)

A number of outlet channels 30c are formed in the circumferential portion 23c of the core 20c and configured to discharge cleaning liquid from the elongated conduit 26c to the brush member 40 (FIGS. 1 and 2) which surrounds the core 20c. Each of the outlet channels 30c passes through the circumferential portion 23c of the core 20c and extends from the inner surface 231c to the outer surface 232c of the circumferential portion 23c. A number of groups of the outlet channels 30c are arranged along the longitudinal direction L of the core 20c, and the outlet channels 30c in each group are arranged around the rotation axis R1 of the core 20c. According to one exemplary embodiment of the present disclosure, each of the groups consists of four outlet channels 30c (only three outlet channels of each group are shown in FIG. 13) arranged around the rotation axis R1 of the core 20c.

In some embodiments, some of the outlet channels 30c have varying cross sections along their lengths, but some of the outlet channels 30c have a consistent cross-sectional shape. For example, as shown in FIG. 13, one of the outlet channels 30c has an upstream section 31c and a downstream section 32c. The upstream section 31c extends from the inner surface 231c of the core 20c and is connected to the downstream section 32c. The downstream section 32c extends from the outer surface 232c of the core 20c and is connected to the upstream section 31b. The upstream section 31c includes a round corner which is inclined relative to the inner surface 231c of the circumferential portion 23c, and the downstream section 32c is perpendicular to the outer surface 232c of the circumferential portion 23c.

In some embodiments, a first zone Z1, a second zone Z2 and a third zone Z3 of the core 20c are defined in order along a direction from inlet opening 25c to the closed end portion 24c. The first zone Z1, the second zone Z2 and the third zone Z3 each include multiple groups of outlet channels 30c that are spaced from each other by a constant pitch. Specifically, the outlet channels 30c in the first zone Z1 are spaced apart from each other by a first pitch P1, the outlet channels 30c in the second zone Z2 are spaced apart from each other by a second pitch P2, and the outlet channels 30c in the third zone Z3 are spaced apart from each other by a third pitch P3.

In one exemplary embodiment, the first pitch P1, the second pitch P2 and the third pitch P3 are different from each other. For example, the pitch P2 of the outlet channels 30c in the second zone Z2 is greater than the pitch P1 of the outlet channels 30c in the first zone Z1. In addition, the pitch P3 of the outlet channels 30c in the third zone Z3 is greater than the pitch P2 of the outlet channels 30c in the second zone Z2. Therefore, in unit length of the core 20c, a total volume of the elongated conduit 26c and the outlet channels 30c in zone Z1 is greater that in zone Z2 because the number of the outlet channels 30c in zone Z1 is greater than the number of the outlet channels 30c in zone Z2. In addition, in unit length of the core 20c, a total volume of the elongated conduit 26c and the outlet channels 30c in zone Z2 is greater that in zone Z3 because the number of the outlet channels 30c in zone Z2 is greater than the number of the outlet channels 30c in zone Z3. In one exemplary embodiment, the ratio of pitches P1, P2 and P3 is about 1:2:4.

It should be appreciated that the width of the outlet channels 30c and the number of the outlet channels 30c may be varied and should not be limited to the above embodiments. In addition, geometry, shape and size of the outlet channels 30c can selectively be varied along the length of the core 20c as long as a uniform pressurization can be obtained. For example, the outlet channels 30c in zone Z1, zone Z2 and zone Z3 has widths of W41, W42 and W43, respectively. In one exemplary embodiment, while not illustrated in FIG. 13, the width W43 is greater than the width W42, and the width W42 may be greater than the width W41.

Figure 14:
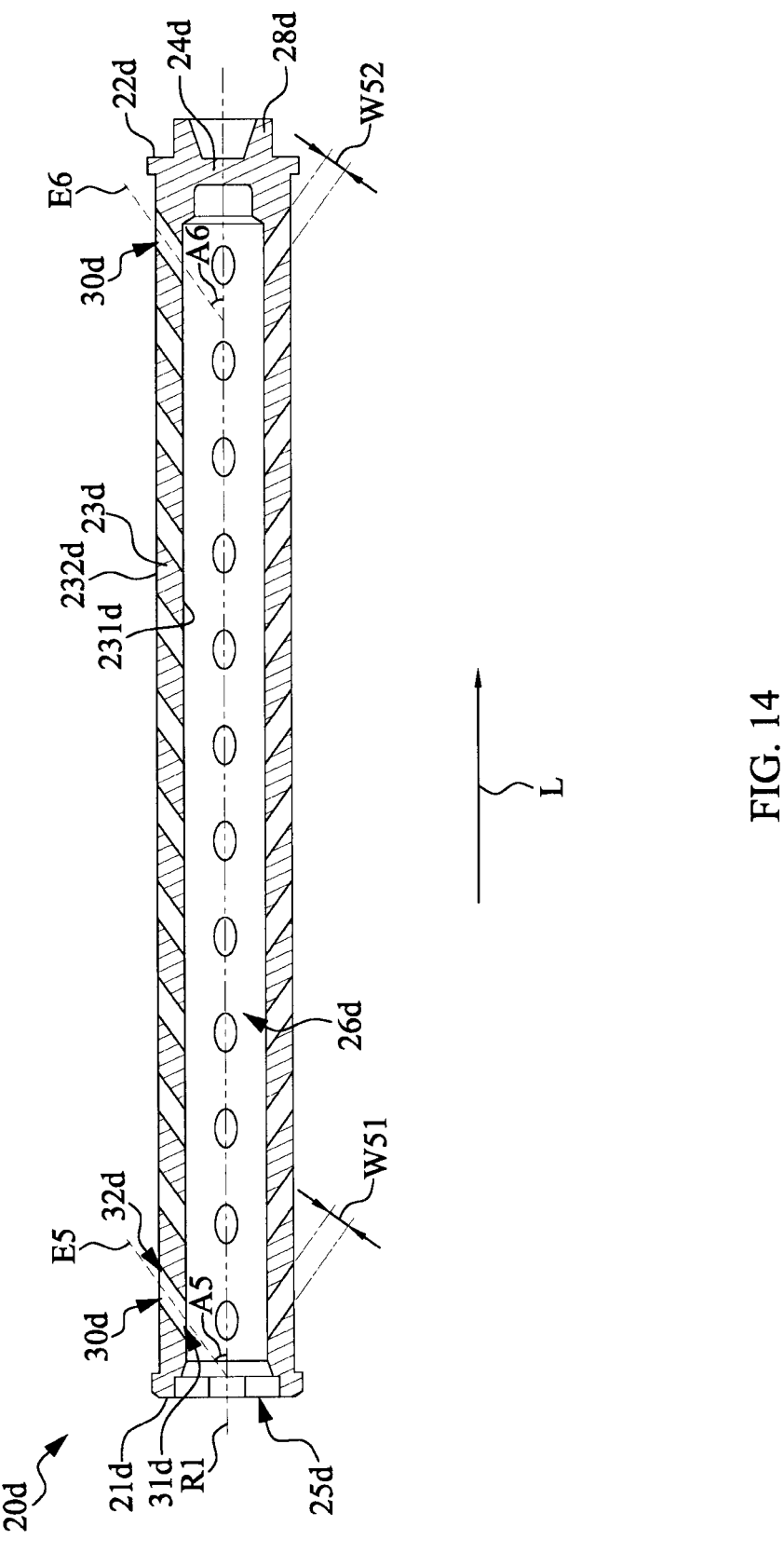
FIG. 14 is a longitudinal perspective section view of a core in accordance with a fifth example embodiment.

FIG. 14 is a longitudinal perspective section view of a core 20d in accordance with a fifth example embodiment. In one illustrative embodiment, the core 20d has a first end 21d and a second end 22d opposite to the first end 21d in a longitudinal direction L of the core 20d. The core 20d includes a circumferential portion 23d around a rotation axis R1 of the core 20d to form a hollow cylindrical shape. An elongated conduit 26d is defined by an inner surface 231d of the circumferential portion 23d. The elongated conduit 26d allows a flow of cleaning liquid along the longitudinal direction L of the core 20d.

An inlet opening 25d is formed at the first end 21d for allowing entry of cleaning liquid into the elongated conduit 26d. The core 20d further includes a closed end portion 24d which connects to the circumferential portion 23d at the second end 22d of the core 20d. The second end 22d of the core 20d is sealed by the closed end portion 24d, and thus no cleaning liquid is allowed to pass through the second end 22d of the core 20d. A flange 28d may be formed at outer surface of the closed end portion 24d for the connection of the core 20d with a tool spindle (not shown in the figures.)

A number of outlet channels 30d are formed in the circumferential portion 23d of the core 20d and configured to discharge cleaning liquid from the elongated conduit 26d to the brush member 40 (FIGS. 1 and 2) which surrounds the core 20d. Each of the outlet channels 30d passes through the circumferential portion 23d of the core 20d and extends from the inner surface 231d to the outer surface 232d of the circumferential portion 23d. Two ends of the outlet channels 30d form an inlet hole 31d and an outlet hole 32d on the inner surface 231d and the outlet surface 232d of the core 23d. A number of groups of the outlet channels 30d are arranged along the longitudinal direction L of the core 20d in fixed or varied pitches, and the outlet channels 30d in each group are arranged around the rotation axis R1 of the core 20d. According to one exemplary embodiment of the present disclosure, each of the groups consists of four outlet channels 30d (only three outlet channels of each group are shown in FIG. 14) arranged around the rotation axis R1 of the core 20d.

In some embodiments, the outlet channel 30d is outwardly tilted toward the closed end portion 24d. Specifically, the outlet channel 30d that is closest to the inlet opening 25d extends in an extension axis E5 and is inclined relative the inner surface 231d of the circumferential portion 23d. The extension axis E5 forms a tilt angle A5 with respect to the rotation axis R1. The outlet channel 30d that is closest to the closed end portion 24d extends in an extension axis E6 and is inclined relative the inner surface 231d of the circumferential portion 23d. The extension axis E6 forms a tilt angle A6 with respect to the rotation axis R1. The tilt angles A5 and A6 may be in a range of about 20 degrees to about 90 degrees, preferably in a range of about 30 degrees to about 60 degrees. In one exemplary embodiment, the tilt angles A5 and A6 are about 45 degrees. As shown in FIG. 14, due to the inclined arrangement, the inlet holes 31d of the outlet channels 30d have oval shapes. The purpose of having outlet channels 30d tilted toward the closed end portion (i.e., aligning with the direction of flow) is to reduce resistance to the flow of fluid in the core 20d so that more flow volume exits out of the outlet channels 30d as compared with outlet channels being perpendicular to the direction of flow.

In some embodiments, the tilt angle of the outlet channels 30d that is close to the closed end portion 24d become steeper than that of the outlet channels 30d that is close to the inlet openings 25d. For example, the tilt angle A6 may be greater than the tilt angle A5. In one exemplary embodiment, while not illustrated in FIG. 14, the tilt angle A5 is about 20 degrees, and the tilt angle A6 is about 90 degrees. With such arrangement, the uniformity of fluid distribution in the core 20d may be further improved.

It should be appreciated that the width of the outlet channels 30d and the number of the outlet channels 30d may be varied and should not be limited to the above embodiments. In addition, geometry, shape and size of the outlet channels 30d can selectively be varied along the length of the core 20d as long as a uniform pressurization can be obtained. For example, the outlet channel 30d that is closest to the inlet opening 25d has a width W51, and the outlet channel 30d that is closest to the closed end portion 24d has a width W52. The width W51 may be greater than the width W52.

Figure 15:
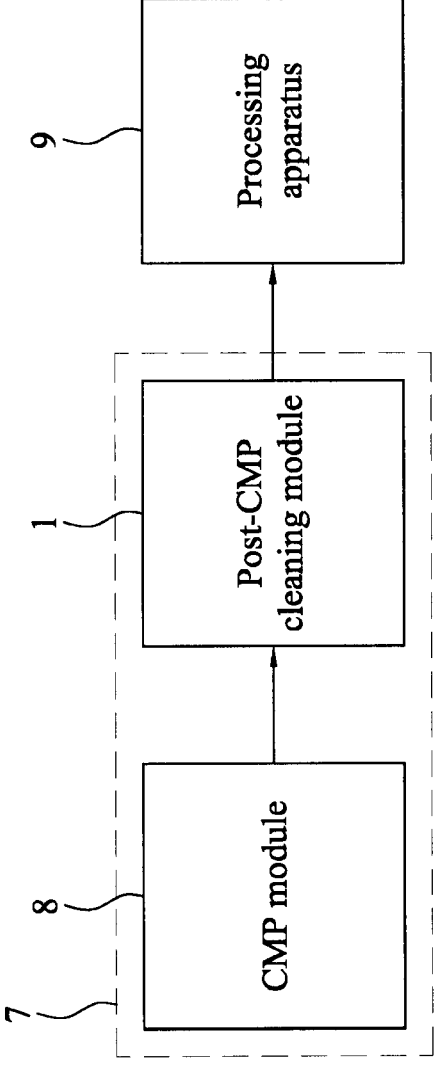
FIG. 15 is a block diagram of a CMP module and a processing tool for another semiconductor process following a CMP process, in accordance with some embodiments.

FIG. 15 is a block diagram of a CMP module 7 and a processing apparatus 9 for a subsequent process following a CMP process, in accordance with some embodiments. In some embodiments, the CMP module 7 includes a CMP module known in the art and a post-CMP cleaning module, such as post-CMP cleaning module 1 as depicted in FIG. 1. The post-CMP cleaning module 1 is positioned at a downstream of the CMP module 7 to receive wafers from the CMP module. The processing apparatus 9 may be any processing tool to perform a suitable process over the semiconductor wafer after a CMP process. For example, the processing apparatus 9 may be a tool to form a film on the semiconductor wafer by CVD, PVD, ALD or any other suitable methods.

In operation, a CMP process is performed over a semiconductor wafer by CMP module 7, and then the wafer is cleaned in the post-CMP cleaning module 1. In some embodiments, prior to the loading of the wafer in the post-CMP cleaning module 1, cleaning liquid is supplied into the cores of any embodiments of the present disclosure to rinse the brush members 40 so as to remove particles thereon. After the brush member 40 is cleaned, the wafer is loaded into the post-CMP cleaning module 1 for a post-CMP cleaning process. In the post-CMP cleaning process, cleaning liquid is supplied into the cores to rinse the brush members 40, and the cleaning brushes 10 are rotated to clean the surfaces of the wafer by the brush members 40. After the completion of the post-CMP cleaning process, the wafer is removed from the post-CMP cleaning module 1, and the cleaning liquid is once again supplied into the cores to rinse the brush members 40 so as to remove particles which attach to the brush member during the post-CMP cleaning process. The wafer can be further processed in the processing apparatus 9.

In the post-CMP cleaning module 1, since the cores thereof have a superior uniform fluid distribution along its length, the post-CMP cleaning module 1 exhibits a higher particle removal efficiency across the length of the brush member and across the entire surface of the semiconductor wafer as compared with the conventional cleaning module. As a result, the period of time needed for cleaning the brush member or the wafer may be reduced, which results in reduced water consumption and an eco-friendly manufacturing process. In addition, by comprehensively cleaning the brush member before and after the cleaning process, defect count on wafer, which is used to monitor the condition of the brush member, can be controlled. Therefore, the lifetime of the cleaning brush can be prolonged and the manufacturing cost is reduced. Furthermore, since the contamination is sufficiently removed from the semiconductor wafer, the product yield of the semiconductor wafer may be improved.

The following embodiments, designated by letter and number, are intended to further illustrate the present disclosure but should not be construed to unduly limit this disclosure.

A1. A cleaning brush, comprising:
a core comprising:
    a circumferential portion surrounding a rotation axis of the cleaning brush and defining an inlet opening for receiving a fluid; and
    a closed end portion connected to an end of the circumferential portion that is opposite to the inlet opening along the rotation axis,
    wherein at least one elongated conduit is defined within the core and fluidly communicated with the inlet opening, and the circumferential portion includes a plurality of outlet channels passing therethrough to fluidly communicate with the elongated conduit, the outlet channels being tilted outwardly toward the closed end portion; and
    a brush member connected to an outer surface of the circumferential portion and covering all of the plurality of outlet channels.

A2. The cleaning brush according to embodiment A1, the outlet channels are tilted toward the closed end portion by a tilt angle ranged from about 20 degrees to about 90 degrees.

A3. The cleaning brush according to embodiment A2, the plurality of outlet channels include a first outlet channel and a second outlet channel located closer to the closed end portion than the first outlet channel, wherein the tilt angle of the second outlet channel is greater than the tilt angle of the first outlet channel.

A4. The cleaning brush according to embodiments A1-A3, wherein each of the outlet channels includes: an upstream section connected to the inner surface of the circumferential portion; and at least one downstream section connected the upstream section to the outer surface of the circumferential portion, wherein the upstream section is tilted relative to the inner surface of the circumferential portion and the downstream section is perpendicular to the outer surface of the circumferential portion.

A5. The cleaning brush according to embodiment A4, wherein each of the outlet channels includes two downstream sections diverging from the upstream section and extending to the outer surface of the circumferential portion, and a width of the two downstream sections is less than a width of the upstream section.

A6. The cleaning brush according to embodiment A4, a width (D) of the elongated conduit, a width (W11) of the upstream section of one of the outlet channels, and a width (W13) of the downstream section satisfy the following equations (1) and (2):

$$D^3 = \sum_{k=0}^{n} k(W11)^3 \qquad (1)$$

-continued
$$(W11)^3 = \sum_{i=0}^{n} i(W13)^3, \qquad (2)$$

where k is the total number of the upstream sections, and i is the total number of the downstream sections.

A7. The cleaning brush according to embodiments A1-A6, wherein each of the outlet channels includes: an upstream section connected to the inner surface of the circumferential portion; and at least one downstream section connected the upstream section to the outer surface of the circumferential portion, wherein a cross-sectional shape of the upstream section is different from a cross-sectional shape of the downstream section.

A8. The cleaning brush according to embodiments A1-A7, wherein the plurality of outlet channels comprise a first outlet channel and a second outlet channel located farther away from the inlet opening than the first outlet channel, and a cross-sectional shape or a dimension of the first outlet channel is different from a cross-sectional shape or a dimension of the second outlet channel.

A9. The cleaning brush according to embodiments A1-A8, the circumferential portion includes a round corner or a chamfer at an intersection of at least one of the outlet channels and the elongated conduit.

B1. A cleaning brush, comprising:
a core comprising:
    a circumferential portion surrounding a rotation axis of the cleaning brush and defining an inlet opening for receiving a fluid; and
    a closed end portion connected to an end of the circumferential portion that is opposite to the inlet opening along the rotation axis,
    wherein at least one elongated conduit is defined within the core and fluidly communicated with the inlet opening, and the circumferential portion includes a plurality of outlet channels passing therethrough to fluidly communicate with the elongated conduit,
    wherein a first zone, a second zone and a third zone of the core are defined in order along a direction from the inlet opening to the closed end portion, a total volume, in unit length of the core, of the elongated conduit and the outlet channels within the respective first, second and third zones gradually decreases; and
    a brush member connected to an outer surface of the circumferential portion and covering all of the plurality of outlet channels.

B2. The cleaning brush according to embodiment B1, wherein the at least one inlet opening comprises a first, a second and a third inlet opening arranged adjacent to each other and concentrically arranged relative to the rotation axis of the cleaning brush, and the at least one elongated conduit comprises a first, a second and a third elongated conduit, wherein the first, the second and the third elongated conduits each fluidly communicate with at least one of the outlet channels of the core, and an outlet volume of the outlet channel that is connected to the first elongated conduit is different from an outlet volume of the outlet channel that is connected to the second or the third elongated conduit, so as to provide a preferential flow or a targeted flow in different locations of the core.

B3. The cleaning brush according to embodiment B2, wherein a distance between two adjacent outlet channels gradually increases or gradually decreases in a direction away from the inlet opening.

B4. The cleaning brush according to embodiment B3, wherein a distance between the first two outlet channels that are closest to the inlet opening is the smallest, and a distance between the last two of the outlet channels that are farthest away from the inlet opening is greatest.

B5. The cleaning brush according to embodiment B1, wherein a thickness of the circumferential portion gradually increases in a direction away from the inlet opening such that the outlet channel located approximate to the closed end portion has the greatest length in a radial direction of the core that is perpendicular to the rotation axis.

C1. A CMP (chemical mechanical planarization) apparatus, comprising:

a CMP module configured to perform a CMP process over a semiconductor wafer;

a post-CMP cleaning module positioned at a downstream of the CMP module and comprising a core and a brush material surrounding the core and configured to perform a cleaning process over the semiconductor wafer, wherein an inlet opening, an elongated conduit and a plurality of outlet channels are arranged in the core to guide a liquid flowing into the core via the inlet opening to the brush material by passing through the elongated conduit and the outlet channels, wherein at least one of the following parameters of a first and a second of the outlet channels spaced from the inlet opening by different distances are different such that a preferential flow distribution or a targeted flow distribution of the liquid in the core is exhibited:

a width of the outlet channels;

a cross-sectional shape of the outlet channels; and a tilt angle of the outlet channels relative to a length direction of the core.

C2. The cleaning brush according to embodiment C1, wherein the second outlet channel is located farther away from the inlet opening than the first outlet channel, and the width of the second outlet channel is less than the width of the first outlet channel.

C3. The cleaning brush according to embodiments C1-C2, wherein the second outlet channel is located farther away from the inlet opening than the first outlet channel, and the tilt angle of the second outlet channel is greater than the tilt angle of the first outlet channel.

C4. The cleaning brush according to embodiments C1-C3, wherein the first and the second outlet channels are the first two outlet channels that are closest to the inlet opening, a distance between the first and the second outlet channels is the smallest, and a distance between two of the outlet channels that are farthest away from the inlet opening is greatest.

C5. The cleaning brush according to embodiments C1-C4, wherein either one of the first or the second outlet channel has a varied cross-sectional area along its length.

C6. The cleaning brush according to embodiments C1-C5, wherein wherein a width (D) of the elongated conduit, a width (W) of one of the outlet channels satisfy the following equation, where n is the total number of the outlet channels:

$$D^3 = \sum_{k=0}^{n} k(W)^3$$

where k is the total number of the outlet channels.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A cleaning brush, comprising: a core comprising:

a circumferential portion surrounding a rotation axis of the cleaning brush and defining an inlet opening for receiving a fluid and a closed end portion connected to an end of the circumferential portion that is opposite to the inlet opening along the rotation axis, wherein at least one elongated conduit is defined within the core and fluidly communicated with the inlet opening, and the circumferential portion includes a plurality of outlet channels passing therethrough to fluidly communicate with the elongated conduit, the outlet channels being tilted outwardly toward the closed end portion; and a brush member connected to an outer surface of the circumferential portion and covering all of the plurality of outlet channels, wherein each of the outlet channels includes an upstream section connected to the inner surface of the circumferential portion and at least one downstream section connected the upstream section to the outer surface of the circumferential portion, wherein the upstream section is tilted relative to the inner surface of the circumferential portion and the downstream section is perpendicular to the outer surface of the circumferential portion, and wherein a width (D) of the elongated conduit, a width (W11) of the upstream section of one of the outlet channels, and a width (W13) of the downstream section satisfy the following equations (1) and (2):

$$D^3 = \Sigma(\text{from } k=0 \text{ to } n)k(W11)^3 \quad (1)$$

$$(W11)^3 = \Sigma(\text{from } i=0 \text{ to } n)i(W13)^3 \quad (2)$$

where k is the total number of the upstream sections, and i is the total number of the downstream sections.

2. The cleaning brush of claim 1, wherein the outlet channels are tilted toward the closed end portion by a tilt angle ranged from about 20 degrees to about 90 degrees.

3. The cleaning brush of claim 2, wherein the plurality of outlet channels include a first outlet channel and a second outlet channel located closer to the closed end portion than the first outlet channel, wherein the tilt angle of the second outlet channel is greater than the tilt angle of the first outlet channel.

4. The cleaning brush of claim 1, wherein each of the outlet channels includes two downstream sections diverging from the upstream section and extending to the outer surface of the circumferential portion, and a width of the two downstream sections is less than a width of the upstream section.

5. The cleaning brush of claim 1, wherein each of the outlet channels includes: an upstream section connected to the inner surface of the circumferential portion; and at least one downstream section connected the upstream section to the outer surface of the circumferential portion, wherein a cross-sectional shape of the upstream section is different from a cross-sectional shape of the downstream section.

6. The cleaning brush of claim 1, wherein the plurality of outlet channels comprise a first outlet channel and a second outlet channel located farther away from the inlet opening than the first outlet channel, and a cross-sectional shape or a dimension of the first outlet channel is different from a cross-sectional shape or a dimension of the second outlet channel.

7. The cleaning brush of claim 1, wherein the circumferential portion includes a round corner or a chamfer at an intersection of at least one of the outlet channels and the elongated conduit.

8. A CMP (chemical mechanical planarization) apparatus, comprising:

a CMP module configured to perform a CMP process over a semiconductor wafer;

a post-CMP cleaning module positioned at a downstream of the CMP module and comprising a core and a brush material surrounding the core and configured to perform a cleaning process over the semiconductor wafer, wherein an inlet opening, an elongated conduit and a plurality of outlet channels are arranged in the core to guide a liquid flowing into the core via the inlet opening to the brush material by passing through the elongated conduit and the outlet channels, wherein at least one of the following parameters of a first and a second of the outlet channels spaced from the inlet opening by different distances are different such that a preferential flow distribution or a targeted flow distribution of the liquid in the core is exhibited: a width of the outlet channels; a cross-sectional shape of the outlet channels; and a tilt angle of the outlet channels relative to a length direction of the core, and wherein a width (D) of the elongated conduit, a width (W) of one of the outlet channels satisfy the following equation, where n is the total number of the outlet channels:

$$D^3 = \Sigma(\text{from } k=0 \text{ to } n)k(W)^3$$

where k is the total number of the outlet channels.

9. The CMP apparatus of claim 8, wherein the second outlet channel is located farther away from the inlet opening than the first outlet channel, and the width of the second outlet channel is less than the width of the first outlet channel.

10. The CMP apparatus of claim 8, wherein the second outlet channel is located farther away from the inlet opening than the first outlet channel, and the tilt angle of the second outlet channel is greater than the tilt angle of the first outlet channel.

11. The CMP apparatus of claim 8, wherein the first and the second outlet channels are the first two outlet channels that are closest to the inlet opening, a distance between the first and the second outlet channels is the smallest, and a distance between two of the outlet channels that are farthest away from the inlet opening is greatest.

12. The CMP apparatus of claim 8, wherein either one of the first or the second outlet channel has a varied cross-sectional area along its length.

* * * * *